(12) United States Patent
Vatelmacher et al.

(10) Patent No.: US 10,868,204 B2
(45) Date of Patent: Dec. 15, 2020

(54) SOLAR ARRAY MODULE SYSTEM WITH PASSIVE SWITCHING

(71) Applicant: SOLARWAT LTD, Even Yehuda (IL)

(72) Inventors: Boris Vatelmacher, Ganei Tikva (IL); Alexander Schuster, Petah Tikva (IL)

(73) Assignee: SOLARWAT LTD, Even Yehuda (IL)

(*) Notice: Subject to any disclaimer, the term of this patent is extended or adjusted under 35 U.S.C. 154(b) by 84 days.

(21) Appl. No.: 15/756,391

(22) PCT Filed: Sep. 1, 2016

(86) PCT No.: PCT/IL2016/050957
§ 371 (c)(1),
(2) Date: Feb. 28, 2018

(87) PCT Pub. No.: WO2017/037710
PCT Pub. Date: Mar. 9, 2017

(65) Prior Publication Data
US 2018/0254366 A1  Sep. 6, 2018

(30) Foreign Application Priority Data

Sep. 1, 2015  (IL) .......................................... 241029

(51) Int. Cl.
*H01L 31/05* (2014.01)
*H01L 31/042* (2014.01)
(Continued)

(52) U.S. Cl.
CPC ......... *H01L 31/0504* (2013.01); *H01F 27/28* (2013.01); *H01L 31/02008* (2013.01);
(Continued)

(58) Field of Classification Search
CPC ............... H01L 31/0504; H01L 31/042; H01L 31/02008; H01L 31/0508; H01L 31/05;
(Continued)

(56) References Cited

U.S. PATENT DOCUMENTS 4,513,167 A * 4/1985 Brandstetter ....... H01L 31/0504
136/205
5,637,155 A * 6/1997 Inoue ................. H01L 31/0504
136/244

(Continued)

FOREIGN PATENT DOCUMENTS

WO     2012006723 A1    1/2012
WO     2013144963 A1   10/2013

(Continued)

OTHER PUBLICATIONS

International Search Report; PCT Application No. PCT/IL2016/050957; dated Mar. 9, 2017.

(Continued)

*Primary Examiner* — Andrew J Golden
(74) *Attorney, Agent, or Firm* — Polsinelli PC

(57) ABSTRACT

A solar array module system for generating electric-power, preconfigured to prevent electric blockage of the module when a physical row of solar cells malfunctions. The module includes a matrix of X physical rows and Y columns of solar cells, electrically interconnected in a plain criss-cross matrix. The columns of the physical matrix are divided into a first side, numbering $Y_L$ columns, and a second side, numbering $Y-Y_L$ columns. The first side includes cells that are physically inverted relative to the cells of the second side. The negative side of the cell in the $1+n^{th}$ physical row of column $Y_L$ is electrically connected to the negative side of the cell in the $X-n^{th}$ physical row of column $Y_{L+1}$ ($0 \leq n < X$). The positive side of the cell in the $X^{th}$ physical row of column $Y_L$ is electrically connected to the positive side of the cell in the $1^{st}$ physical row of column $Y_{L+1}$.

7 Claims, 22 Drawing Sheets

(51) Int. Cl.
*H01F 27/28* (2006.01)
*H01L 31/02* (2006.01)
*H02M 3/02* (2006.01)

(52) U.S. Cl.
CPC .......... *H01L 31/042* (2013.01); *H02M 3/02* (2013.01); *H01L 31/02021* (2013.01); *Y02E 10/50* (2013.01)

(58) Field of Classification Search
CPC .... H01L 31/02021; H02M 3/02; H02S 40/30; H02S 40/34; H02J 3/383
USPC .......................................................... 136/293
See application file for complete search history.

(56) References Cited

U.S. PATENT DOCUMENTS

| | | | | |
|---|---|---|---|---|
| 6,465,986 | B1* | 10/2002 | Haba | H01M 2/20 320/116 |
| 6,635,817 | B2* | 10/2003 | Chang | H01L 31/02021 136/244 |
| 2010/0313930 | A1* | 12/2010 | Yokobayashi | H01L 31/0504 136/244 |
| 2013/0068277 | A1* | 3/2013 | Kataoka | H01L 31/0504 136/244 |
| 2013/0284233 | A1* | 10/2013 | Kataoka | H01L 31/0504 136/244 |

FOREIGN PATENT DOCUMENTS

| | | | | |
|---|---|---|---|---|
| WO | WO-2013144963 A1 * | 10/2013 | ....... H01L 31/02021 |
| WO | 2017037710 A1 | 3/2017 | |

OTHER PUBLICATIONS

Written Opinion of PCT Application No. PCT/IL2016/050957; dated Mar. 9, 2017.

* cited by examiner

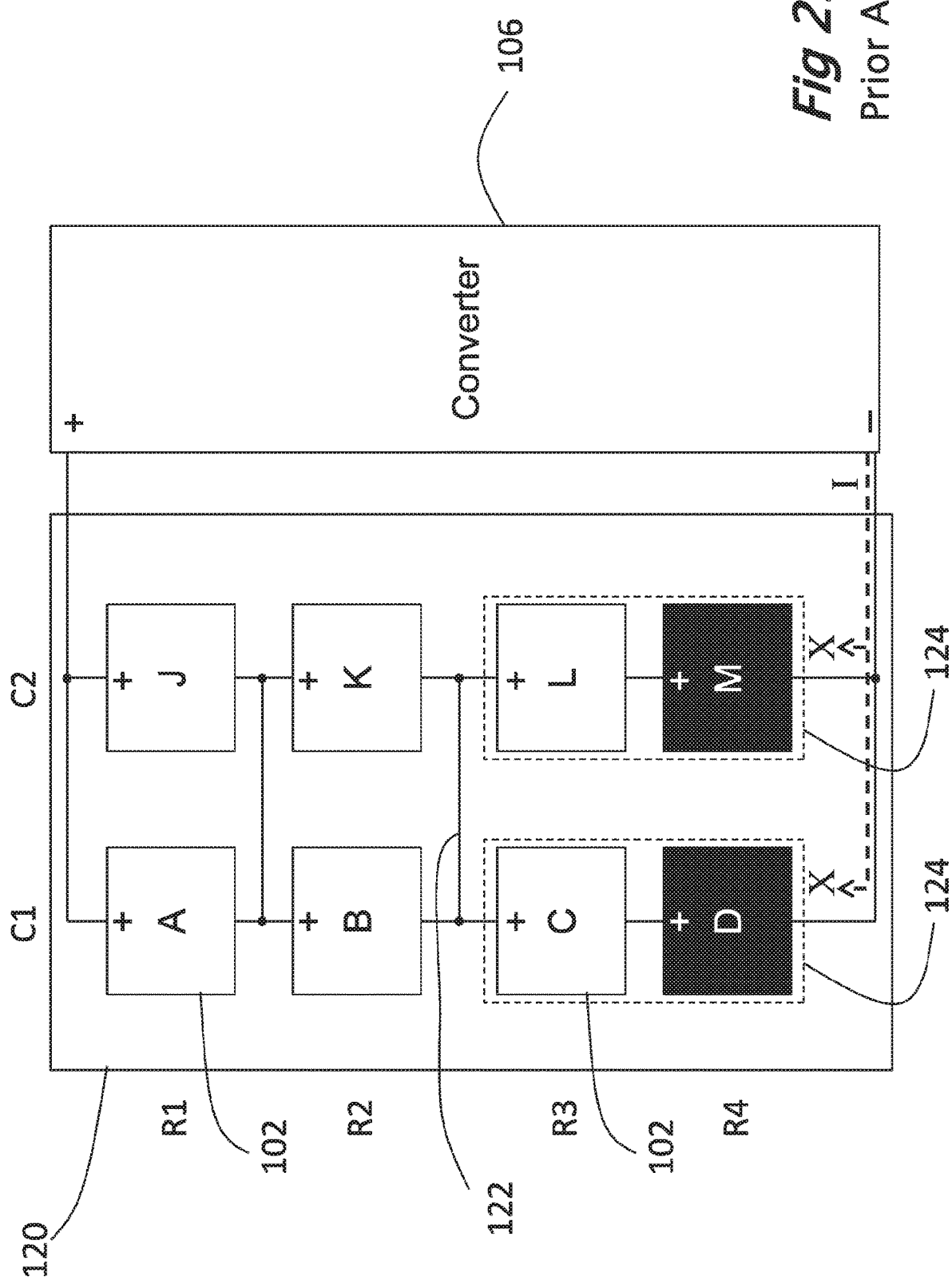

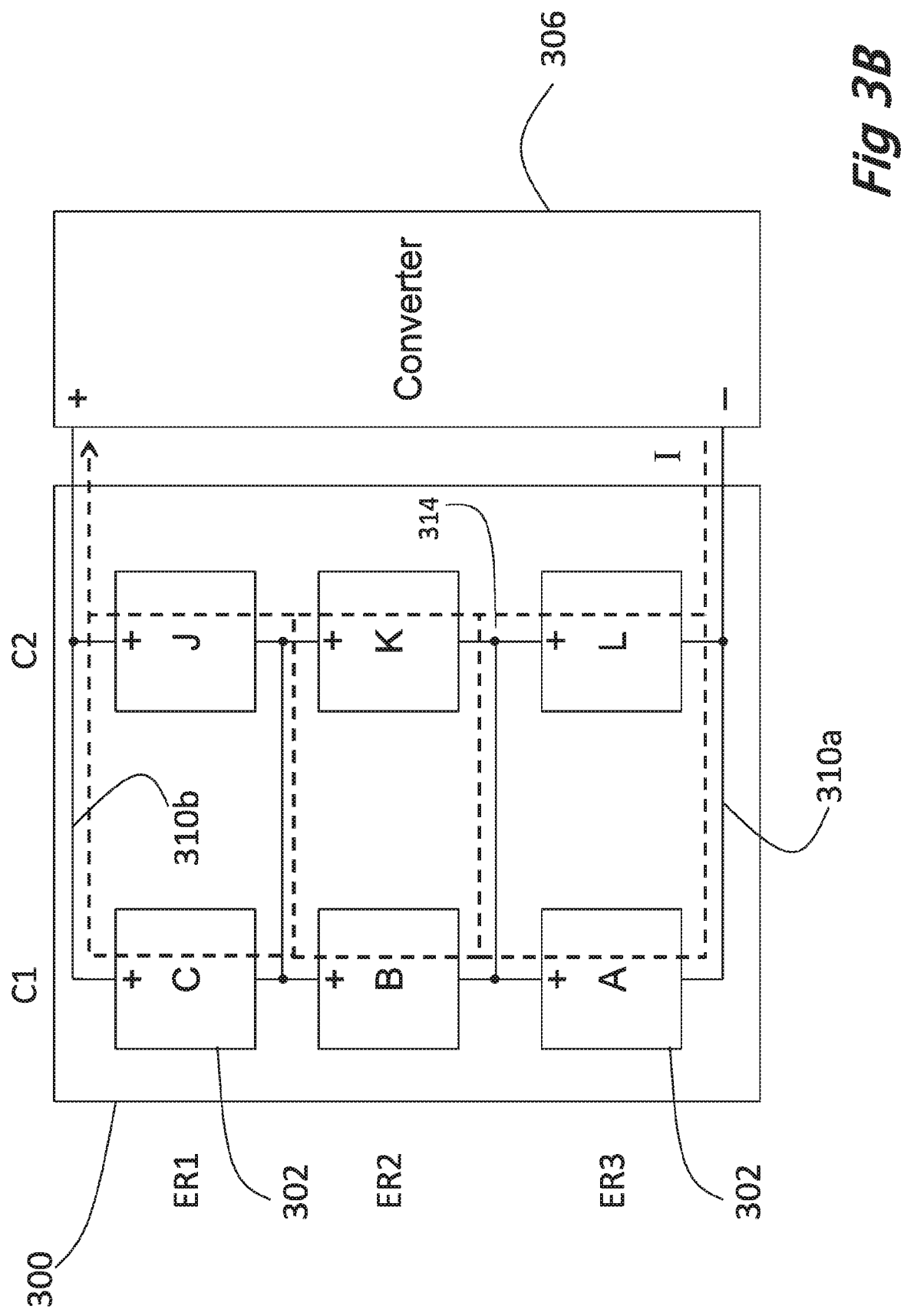

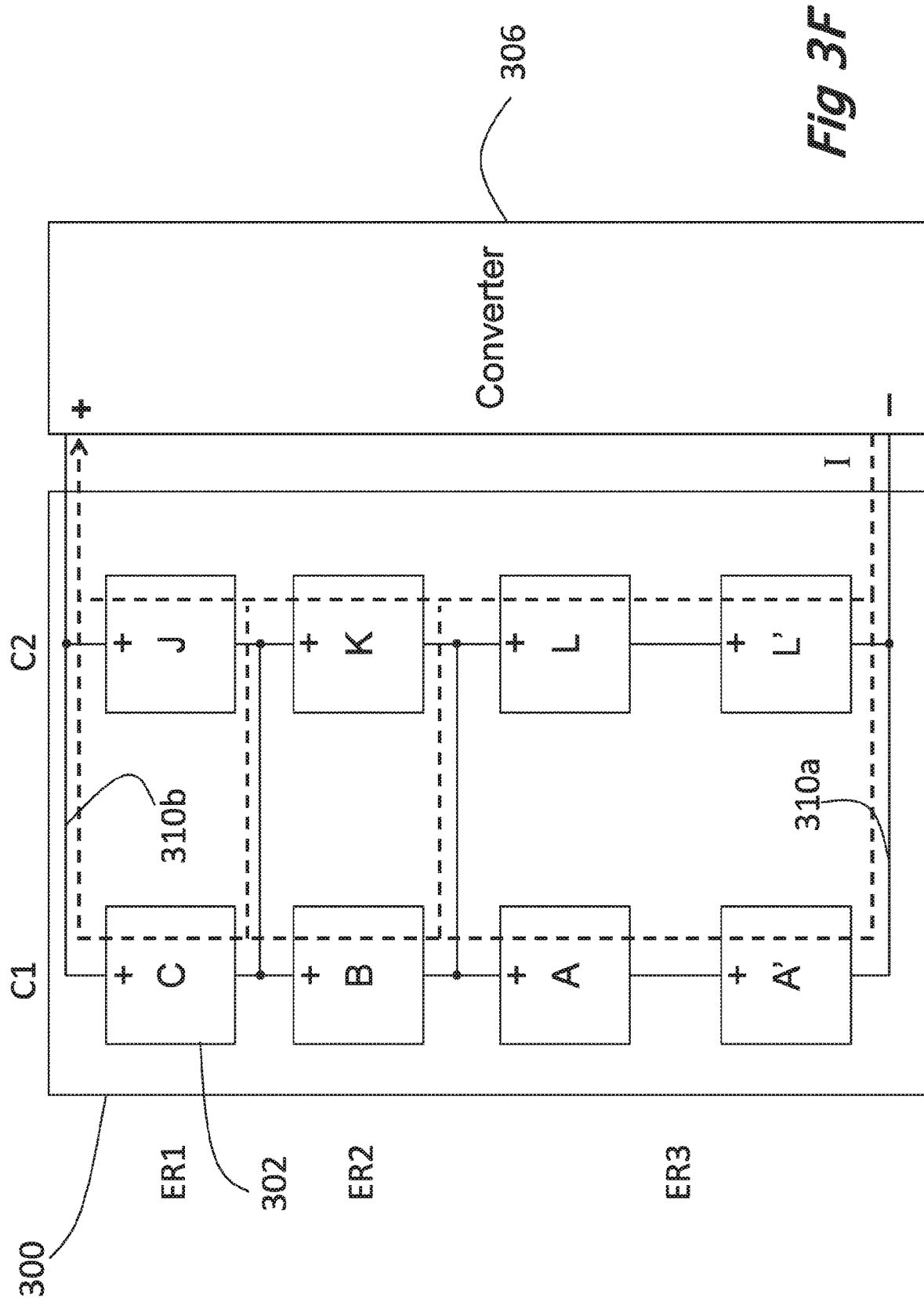

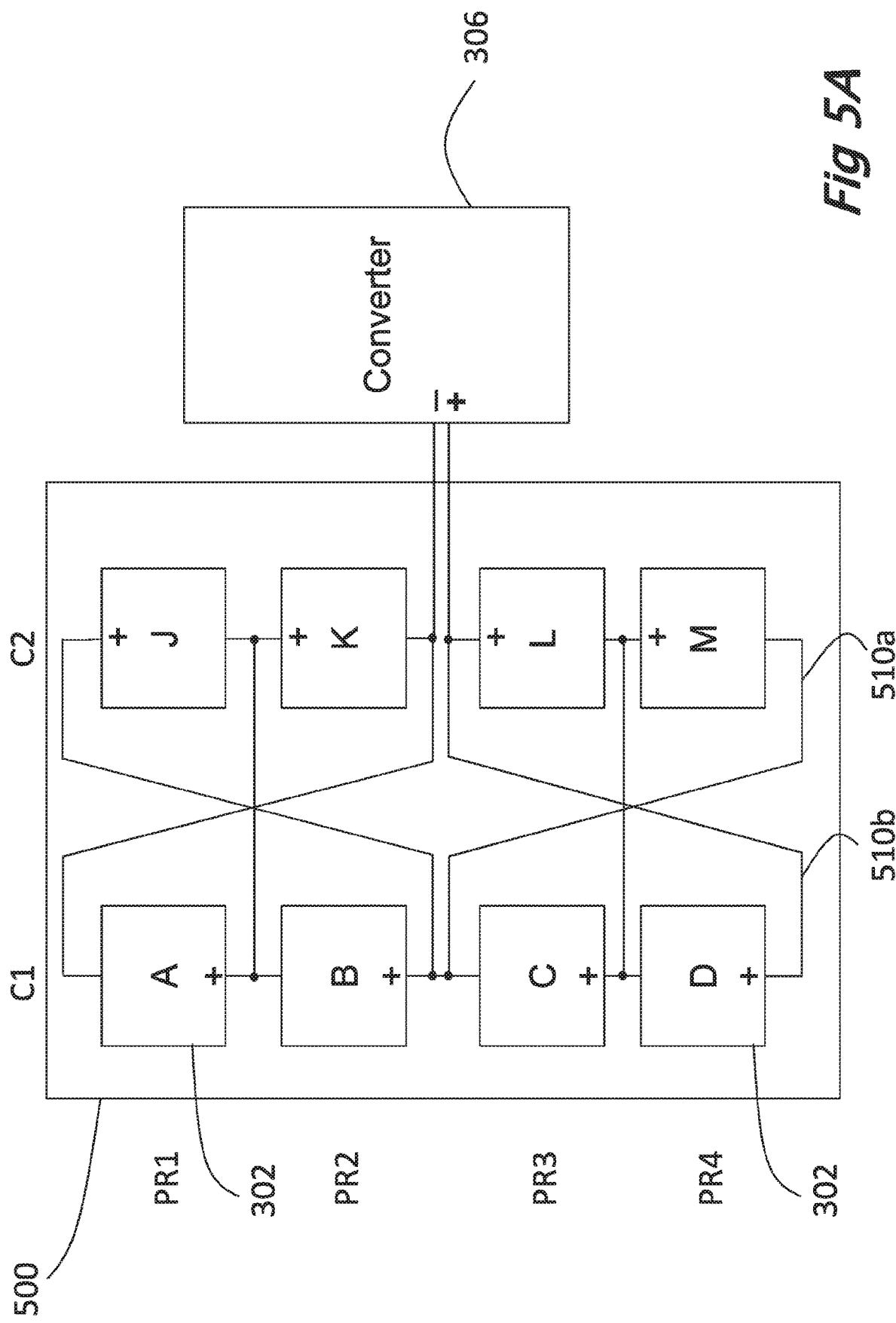

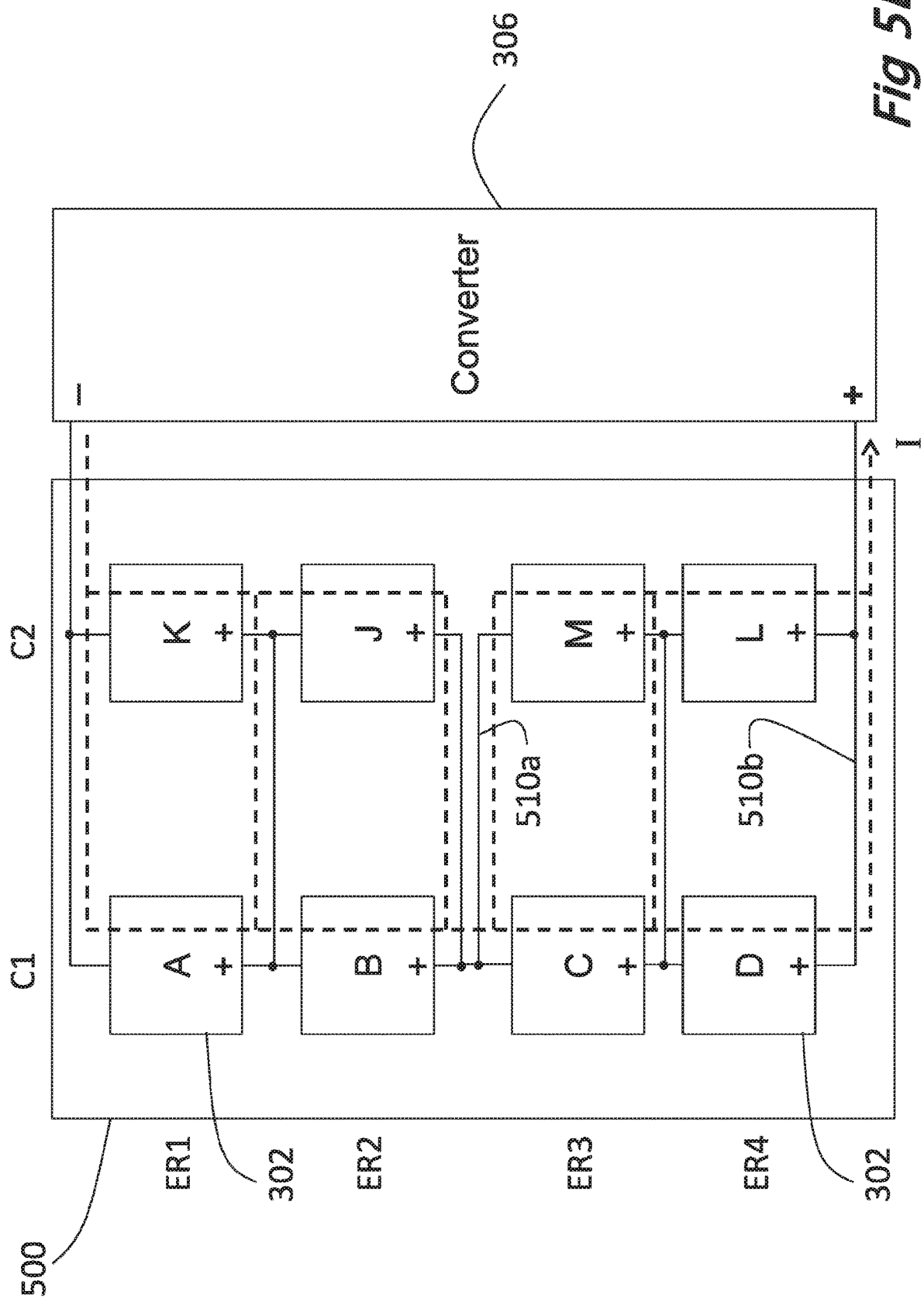

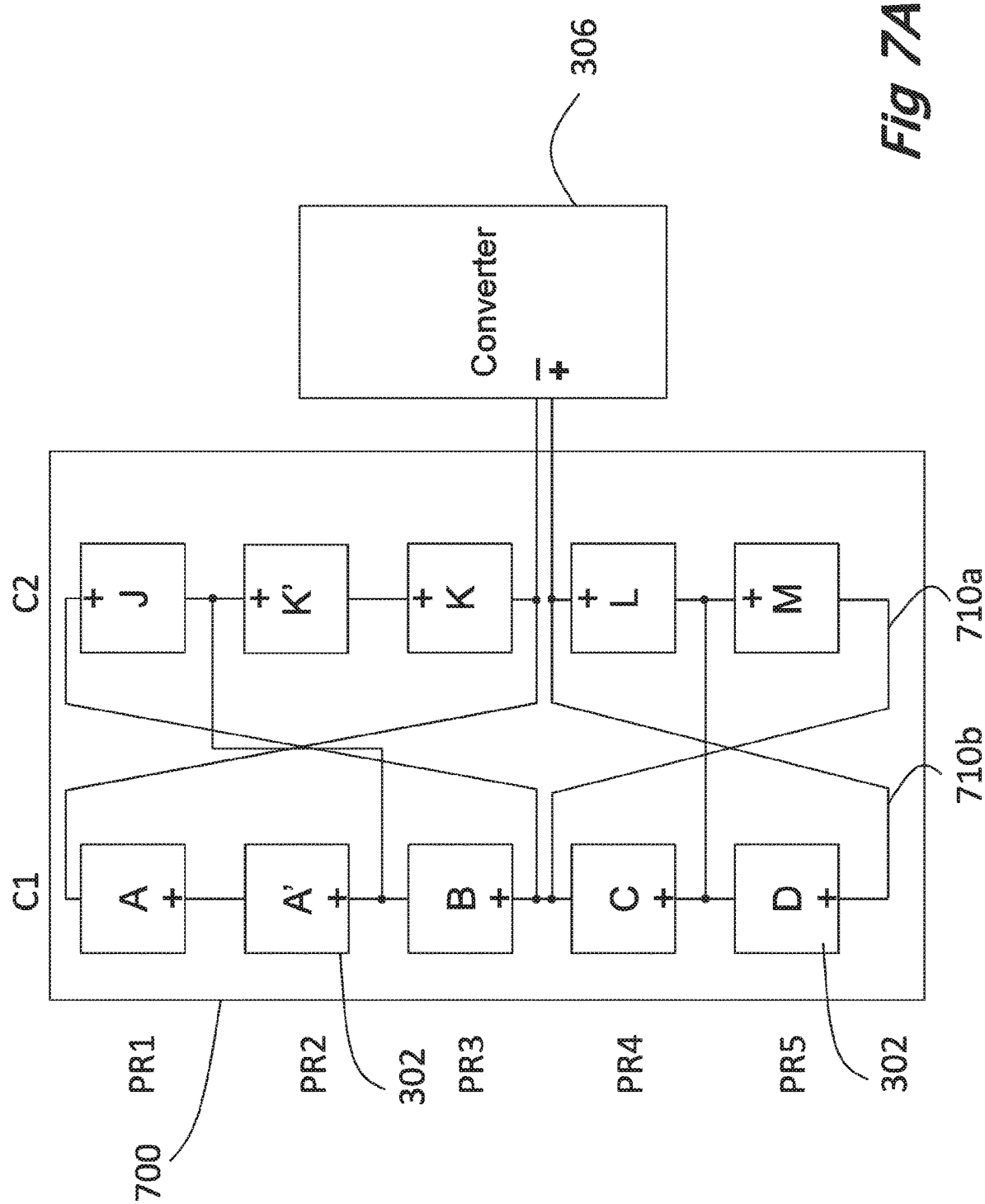

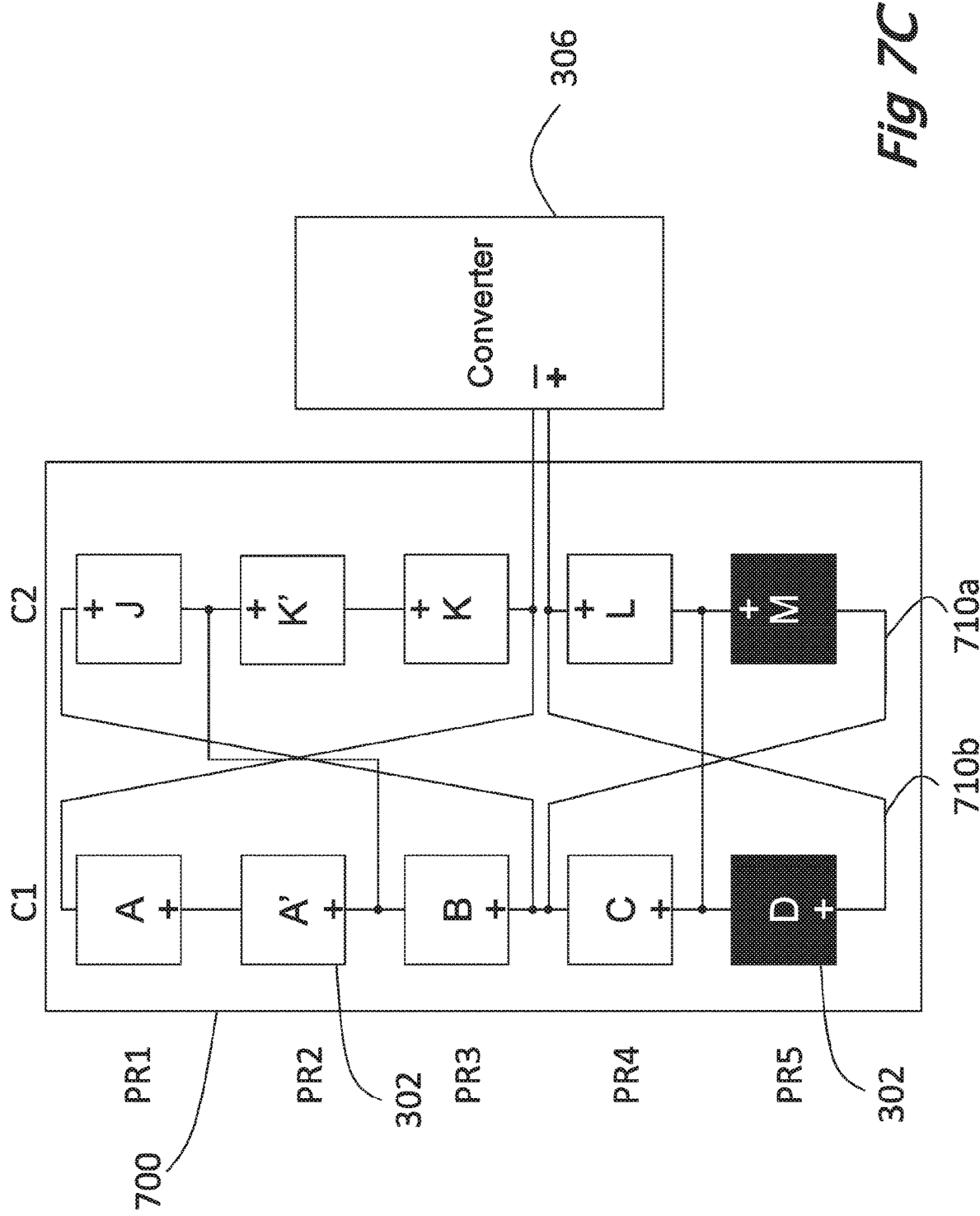

SOLAR ARRAY MODULE SYSTEM WITH PASSIVE SWITCHING

CROSS-REFERENCE TO RELATED APPLICATIONS

This application is a national stage entry of PCT/IL2016/050957 filed Sep. 1, 2016, which claims convention priority from Israeli patent application 241029 filed on Sep. 1, 2015, the contents each of which are hereby incorporated by reference in their entirety.

FIELD OF THE INVENTION

The present in, relates to a solar array module system for generating electric-power and more particularly, to a solar array module system facilitated to maximize the power generation from a solar module, configured to maximize the power generation from a plurality of solar cells, interconnected in a matrix configuration in a light obstruction situation.

BACKGROUND OF THE INVENTION

Photovoltaic cells have been widely used in a variety of applications to generate convenient electricity. Typically, a single solar cell produces an output voltage of around 0.5V, and a plurality of solar cells, typically, with no limitations, that are Silicon based, is conventionally connected in series to provide higher voltage levels.

A solar array system includes solar array modules, wherein each solar array module includes a multiplicity of solar cells. The solar modules are typically tilted towards the sun. However, when the angle of the sun is very low and a front module may cast a shadow on a portion of a neighboring module that is positioned behind the front module, typically on the lower rows of solar cells of the solar-array module. Light may also be blocked or obstructed due to snow, buildings, billboards that typically cast a shadow on one side of the solar-array module. Thereby, the light obstruction causes a substantial reduction in the production yield of the module.

Reference is now made to FIG. 1 showing a prior art geometry of tilted solar modules of a solar-array module 100, tilted at an angle β. In this example, solar-array module 100a and 100b are disposed on a substantially horizontal surface, wherein solar-array module 100a is positioned in front of solar-array module 100b, with respect to the sun. When the sun is at a pitch angle of α above the horizon, solar-array module 100a having a length l, casts a shadow on the ground surface with a displacement of d. No shadow is cast over solar-array module 100b. But, when the sun is at a lower pitch angle than α, such as $α_2$, solar-array module 100a casts a shadow over the lower section of solar-array module 100b. In this example, solar-array module 100a casts a shadow on the region delimited between $P_0$ and $P_2$ of solar-array module 400b, while only the solar cells disposed between $P_2$ and $P_1$ produce electric power.

Reference is also made to FIG. 2A which is a schematic block diagram showing a prior art solar array module 100. Module 100 includes solar cells 102 physically arranged in rows (R1, R2, R3) and columns (C1, C2). While three rows and two columns are shown, it should be appreciated that any size number of rows or columns may be provided and the description below is not limited to a particular size. Cells 102 are typically electrically connected in series as a string of cells 104. Cells 102 are all identically electrically oriented. The output voltage of the module is typically converted by a converter 106. It should be noted the terms "solar cell" and "cell'" are used herein interchangeably, meaning solar cell.

In normal operation, current I is shown as flowing through string of cells 104. In case of a failure of a single cell 102 in a string 104, the current in string 104 will be disrupted. This is illustrated in FIG. 2B, where cell K is shown as malfunctioning or shaded and preventing current I from flowing. Prior art modules may also use diodes or active switching means to bypass malfunctioning cells, but these add cost and complexity.

Reference is now made to FIG. 2C, which shows a solar module 120 with cells 102. FIG. 2C illustrates the solar modules as described in PCT Published Application No. WO/2011/089607 ('607) filed on Jan. 23, 2011 and PCT Published Application No. WO/2013/144963 ('963) filed rut Mar. 30, 2013, by the same inventor as the instant application and which is owned in common, which are hereby incorporated by reference in their entirety.

Module 120 includes solar cells 102 physically arranged in a matrix of rows (R1, R2, R3, R4) and columns (C1, C2). While a matrix of four rows and two columns is shown, it should be appreciated that any size matrix may be provided and the description below is not limited to a particular matrix size. In module 120, individual cells 102 are electrically connected in parallel by electrical connections 122 to create a crisscross electrical matrix. Optionally, a plurality of cells connected in series and herein referred to as a serial unit 102, may be electrically connected in parallel to another serial unit. The crisscross electrical matrix may therefore include individual cells 102 or serial units 124. As above, it is noted that the module 120 may include any number of rows and columns.

In normal operation, current I may flow along a variety of paths due to the crisscross electrical matrix. In FIG. 2C current I is shown as flowing through cells M, L, K, and J as well as M, L, K, and A. In case of a failure of a single cell 102 in module 120, the current will not be disrupted as there are alternative paths. Failure of other cells 102 will also minimally disrupt functioning of the module as long as an alternative path for current flow can be found. However, as illustrated in FIG. 2D, shading of an entire physical row R4, such as caused by the situation described above with reference to FIG. 1, will lead to a loss of power in the entire module as all current flow I in the module will be disrupted.

There is therefore a need and it would be advantageous to have a solar-array module able to maximize the power generated and prevent electrical failure of the module when an individual cell, part of a row of cells, or an entire row of cells malfunction. Such reduced functionality may be due to one or more malfunctioned solar cells, and/or due to obstruction of light from reaching at least a portion of one or more rows of solar cells. It would be further preferable to provide a module that was not dependent on an active switching or bypass mechanism.

SUMMARY OF THE INVENTION

The present invention overcomes the deficiencies of the background art by providing a solar module with passive rerouting of electric current when an individual solar cell, part of a row of cells, or an entire row of cells malfunction. The solar module includes solar cells arranged in a physical matrix of rows and columns where the cells are electrically interconnected in an electrical crisscross matrix arranged in electrical row and columns such that the electrical and physical matrices only partially overlap. A physical row that is fully shaded therefore does not result in a fully shaded electrical row, allowing current to continue flowing in the module. Other causes of reduced functionality due to one or more malfunctioning solar cells and/or due to obstruction of light are similarly overcome by the proposed arrangement.

It should be noted that orientation related descriptions such as "top", "bottom", "horizontal", "vertical" "up", "upper", "down", "low", "lower" and the like, assumes that the solar cell module is situated, with no limitations, such that the positive ("+") side of the array is considered, artificially, with no limitations, as the top side of the array, and the negative ("−") side of the array is considered, artificially, with no limitations, as the bottom side of the array. Alternatively, with no limitations, the negative ("−") side of the array is considered, artificially, with no limitations, as the top side of the array, and the positive ("+") side of the array is considered, artificially, with no limitations, as the bottom side of the array.

It should be further noted that the terms "electrical" or "electrically wired", as used herein refer to the electrical configuration of the matrix, regardless of the physical configuration of the solar cells in the solar panel. Similarly, it should be further noted that the term "physical" as used herein refers to the physical placement of solar cells in the module/panel, regardless of the electrical inter-wiring of the solar cells.

According to some embodiments of the present invention, a non-reconfigurable solar array module that is pre-configured to prevent electric blockage of the module, when at least one physical row of solar cells malfunctions. The solar array module includes a plurality of solar cells arranged in a matrix of physical rows and physical columns, electrical connections connecting the solar cells in each of the columns in series and electrical connections connecting a portion of the solar cells in parallel to form electrical rows of the solar cells, wherein the physical rows and the electrical rows only partially overlap. Optionally, with no limitations, up to half of the physical rows and the electrical rows overlap. Optionally, between 5% and 95% of the physical rows and the electrical rows overlap. Preferably, with no limitations, the number of said columns is larger than the number of rows.

Preferably, the columns are divided into at least a first side and a second side. Each of the electrical rows includes at least one physical row of solar cells on said first side and is electrically connected to solar cells of a different physical row on said second side. The solar cells in the at least one physical row on said first side are connected in parallel and said solar cells in said in least one physical row on said second side are connected in parallel, wherein the solar cells in the at least one physical row of the first side are connected in parallel to the solar cells in the respective at least one physical row of the second side.

Preferably the solar cells on the first side are physically inverted, polarity-wise, with respect to the solar cells on the second side.

Preferably, the solar array module includes X rows, wherein the solar cells of the adjacent columns of the first side and the second side are electrically connected by electrical cross connections. Preferably, the electrical connections include connections from the negative side of the solar cell in the 1+n$^{th}$ row of the first side adjacent column to the negative side of the cell in the X-n$^{th}$ row of the second side adjacent column, wherein n is an integer and 0≤n<X, and a connection from the positive side of the solar cell in the X$^{th}$ row of the first side adjacent column to the positive side of the cell in the 1$^{st}$ row of the second side adjacent column.

Optionally at least one of the solar cells is further electrically connected in series to at least one additional solar cell, to form a serial unit.

Preferably the solar array module further includes a power converter selected from the group consisting of a DC/DC power converter, a DC/DC transformer and a combination thereof. Preferably, the power converter includes a plurality of transistors for alternately connecting the opposite sides in a primary of a transformer to the matrix of solar cells, wherein the operational duty cycle of the transistors is constant and there is a dead time for preventing the fast transistors from conducting simultaneously between the switching time ON to OFF or OFF to ON of the transistor. Preferably the dead time is less than κ% of the duty cycle. Optionally, the transistors are MOSFET transistors or other suitable type of fast switching transistors.

According to a further embodiment of the present invention, a non-reconfigurable solar array module that is pre-configured to prevent electric blockage of the module, when at least one physical row of solar cells malfunctions. The solar array module includes a matrix of X physical rows and Y columns of solar cells, wherein the columns are divided into a first side numbering $Y_L$ columns and a second side numbering Y-$Y_L$ columns. $Y_L$ columns on the first side include solar cells that are physically inverted, polarity-wise, with respect to the solar cells on the second side. The solar cells in each of the columns are connected in series. Solar cells in each of the physical rows on the first side are electrically connected in parallel and solar cells in each of the physical rows on the second side are electrically connected in parallel, wherein the negative side of the solar cell in the 1+n$^{th}$ physical row of column is electrically connected to the negative side of the solar cell in the X-n$^{th}$ physical row of column where n is an integer and 0≤n<X. The positive side of the solar cell in the X$^{th}$ physical row of column $Y_L$ is electrically connected to the positive she of the cell in the 1$^{st}$ physical row of column $Y_{L+1}$. Preferably, the solar array at module further includes a power converter connected to the positive side of physical row 1 and the negative side of physical row X on the second side.

According to a further embodiment of the present invention, a non-reconfigurable solar array module that is pre-configured to prevent electric blockage of the module, when at least one physical row of solar cells malfunctions. The solar array module that includes a matrix of X physical rows and Y columns of solar cells, wherein the columns are divided into a first side numbering $Y_L$ columns and a second side numbering Y-$Y_L$ columns. $Y_L$ columns on the first side include solar cells that are physically inverted, polarity-wise, with respect to the solar cells on the second side. The physical rows of the second side are sub divided into an upper section numbering $X_T$ physical rows, and a lower section numbering X-$X_T$ physical rows. The solar cells in each of the columns on the first side are connected in series, wherein the solar cells in each physical row on the first side are electrically connected in parallel. The solar cells in each of the columns in the upper section of the second side are connected in series, wherein the solar cells in each physical in row of the upper section of the second side are electrically connected in parallel. The solar cells in each column of the lower section of the second side are connected in series, wherein the solar cells in each physical row of the lower section of the second side are electrically connected in parallel. The negative side of the solar cell in the 1+n$^{th}$ physical row of column $Y_L$ is electrically connected to the negative side of the cell in the $X_T$-$n^{th}$ physical row of column $Y_{L+1}$, where n is an integer and $0 \leq n < X_T$, and the positive side of the cell in the $1+n^{th}$ physical row of column $Y_L$ is electrically connected to the positive side of the cell in the $X_T$-$n^{th}$ physical row of column $Y_{L+1}$. The negative side of the cell in the $X_{T+}+n^{th}$ physical row of column $Y_L$ is electrically connected to the negative side of the cell in the X-$n^{th}$ physical row of column $Y_{L+1}$, where n is an integer and $X_{T+1} < n < X$, and the positive side of the cell in the $X^{th}$ physical row of column $Y_L$ is electrically connected to the positive side of the cell in the $X_{T-1}^{th}$ physical row of column $Y_{L+1}$.

Optionally, the solar array module further includes a power converter connected to the positive side of physical row $X_{T-1}$ on the second side and to the negative side of physical row $X_T$ on the second side. Alternatively, the solar array module further includes a power converter connected to the positive side of the $X^{th}$ physical row on the first side and to the negative side of the $1^{st}$ physical row on the first side.

Optionally, at least one of the solar cells is further electrically connected in series to at least one additional said solar cell, to form a serial unit.

According to a further embodiment of the present invention, a non-reconfigurable solar array module that is preconfigured to prevent electric blockage of the module, when at least one physical row of solar cells malfunctions. The solar array module includes: a matrix of X physical rows and Y columns of solar cells, wherein the columns are divided into a first side numbering $Y_L$ columns into a second side numbering $Y-Y_L$; wherein $Y_L$ columns on the first side include cells that are physically inverted, polarity-wise, relative to the cells on the second side; wherein the physical rows of the second side are divided into an upper section numbering $X_T$ physical rows and a lower section numbering $X-X_T$ physical rows; wherein the cells in each of the columns on the first side are connected in series; wherein the cells in each physical row on the first side are electrically connected in parallel; wherein the cells in each of the columns in the upper section of the second side are connected in series; wherein the cells in each physical row of the upper section of the second side are electrically connected in parallel; wherein the cells in each column of the lower section of the second side are connected in series; wherein the cells in each physical row of the lower section of the second side are electrically connected in parallel; wherein the negative side of the cell in the $1^{st}$ physical row of column $Y_L$ is electrically connected to the negative side of the cell in the $X_T^{th}$ physical row of column $Y_{L+1}$; wherein the positive side of the cell in the $X_T^{th}$ physical row of column $Y_L$ is electrically connected to the positive side of the cell in the $1^{st}$ physical row of column $Y_{L+1}$; wherein the negative side of the cell in the $X_T^{th}$ physical row of column $Y_L$ is electrically connected to the negative side of cell in the $1^{st}$ physical row of column $Y_{L+1}$; wherein the negative side of the cell in the $X_{T+1}+n^{th}$ physical row of column $Y_L$ is electrically connected to the negative side of the cell in the X-$n^{th}$ physical row of $Y_{L+1}$ where n is an integer and $X_{T+1} < n < X$, and wherein the positive side of the cell in the $X^{th}$ physical row of column $Y_L$ is electrically connected to the positive side of the cell in the $X_{T+1}^{th}$ physical row of column $Y_{L+1}$.

Preferably, the solar array module further includes a power converter connected to the positive side of physical row $X_{T-1}$ on the second side and to the negative side of physical row $X_T$ on the second side.

An embodiment is an example or implementation of the invention. The various appearances of "one embodiment", "an embodiment" or "some embodiments" do not necessarily all refer to the same embodiments. Although various features of the invention may be described in the context of a single embodiment, the features may also be provided separately or in any suitable combination. Conversely, although the invention may be so described herein in the context of separate embodiments for clarity, the invention may also be implemented in a single embodiment.

Reference in the specification to "one embodiment", "an embodiment", "some embodiments" or "other embodiments" means that a particular feature, structure, or characteristic described in connection with the embodiments is included in at least one embodiment, but not necessarily all embodiments of the invention. It is understood that the phraseology and terminology employed herein is not to be construed as limiting and are for descriptive purposes only.

Unless otherwise defined, all technical and scientific terms used herein have the same meaning as commonly understood by one of average skill in the art to which the present invention belongs. The methods and examples provided herein are illustrative only, and are not intended to be limiting.

BRIEF DESCRIPTION OF THE DRAWINGS

The present invention will become fully understood from the detailed description given herein below and the accompanying drawings, which are given by way of illustration and example only, and thus not limiting in any way, wherein:

FIGS. 2A-2D are schematic diagrams of prior art solar cell modules in non-shaded and shaded conditions;

FIGS. 3A-3F are schematic physical and electrical diagrams of a solar cell module in non-shaded and shaded conditions according to some embodiments of the present invention;

FIGS. 5A-5D are schematic physical and electrical diagrams of a solar cell module in non-shaded and shaded conditions according to some embodiments of the present invention;

FIGS. 7A-7D are schematic physical and electrical diagrams of a solar cell module in non-shaded and shaded conditions according to some embodiments of the present invention.

DETAILED DESCRIPTION OF THE INVENTION

The present invention now will be described more fully hereinafter with reference to the accompanying drawings, in which preferred embodiments of the invention are shown.

The present invention overcomes the deficiencies of the background art providing a solar module with passive rerouting of electric current when an individual solar cell, part of a row of cells, or an entire row of cells malfunction.

The solar module includes solar cells arranged in a physical matrix of rows and columns where the cells are electrically interconnected in an electrical crisscross matrix arranged in electrical rows and columns such that the electrical and physical matrices only partially overlap. A physical row that is fully shaded therefore does not result in a fully shaded electrical row, allowing current to continue flowing in the solar array module. Other causes of reduced functionality due to one or more malfunctioning solar cells and/or due to obstruction of light are similarly overcome by the proposed arrangement.

Figure 1:
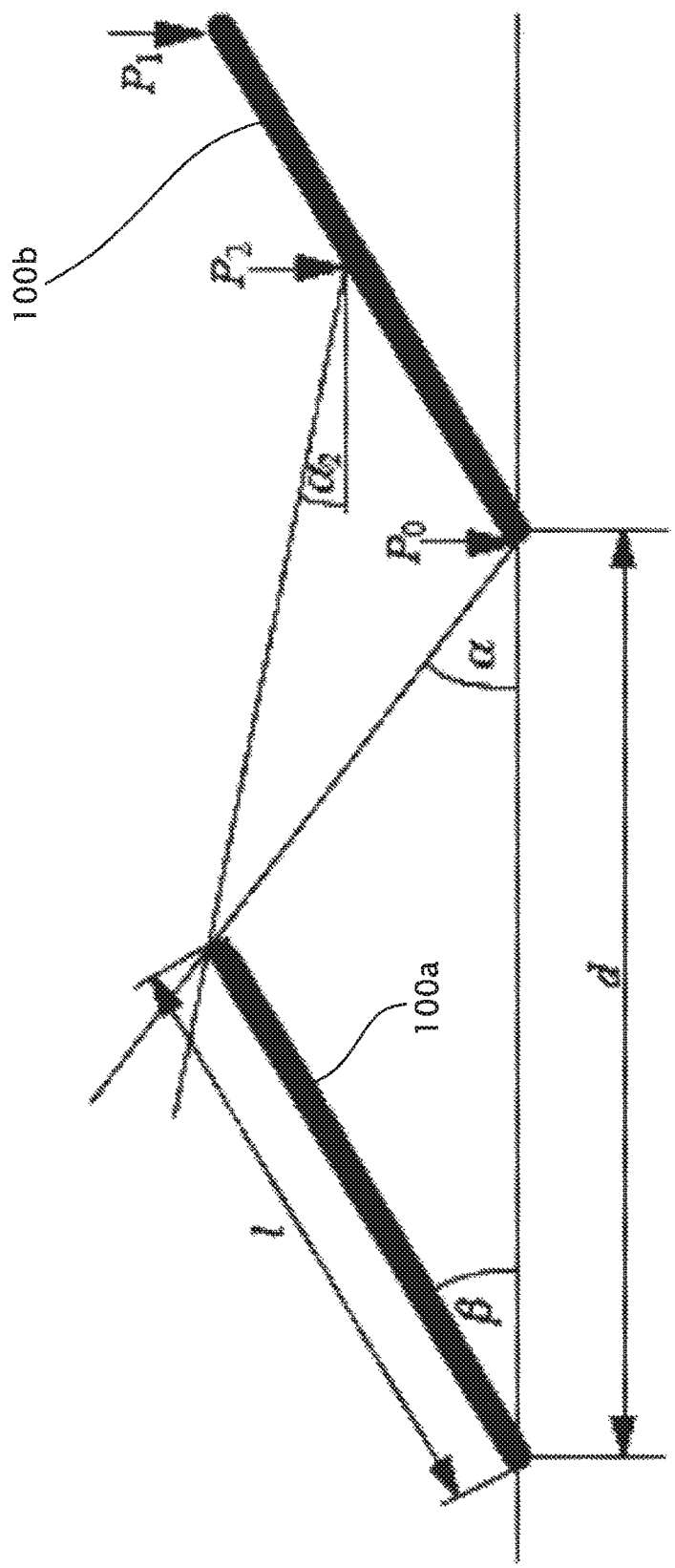
FIG. 1 is a schematic illustration showing the geometry of tilted solar array modules of a prior art solar-system.
Figure 2A:
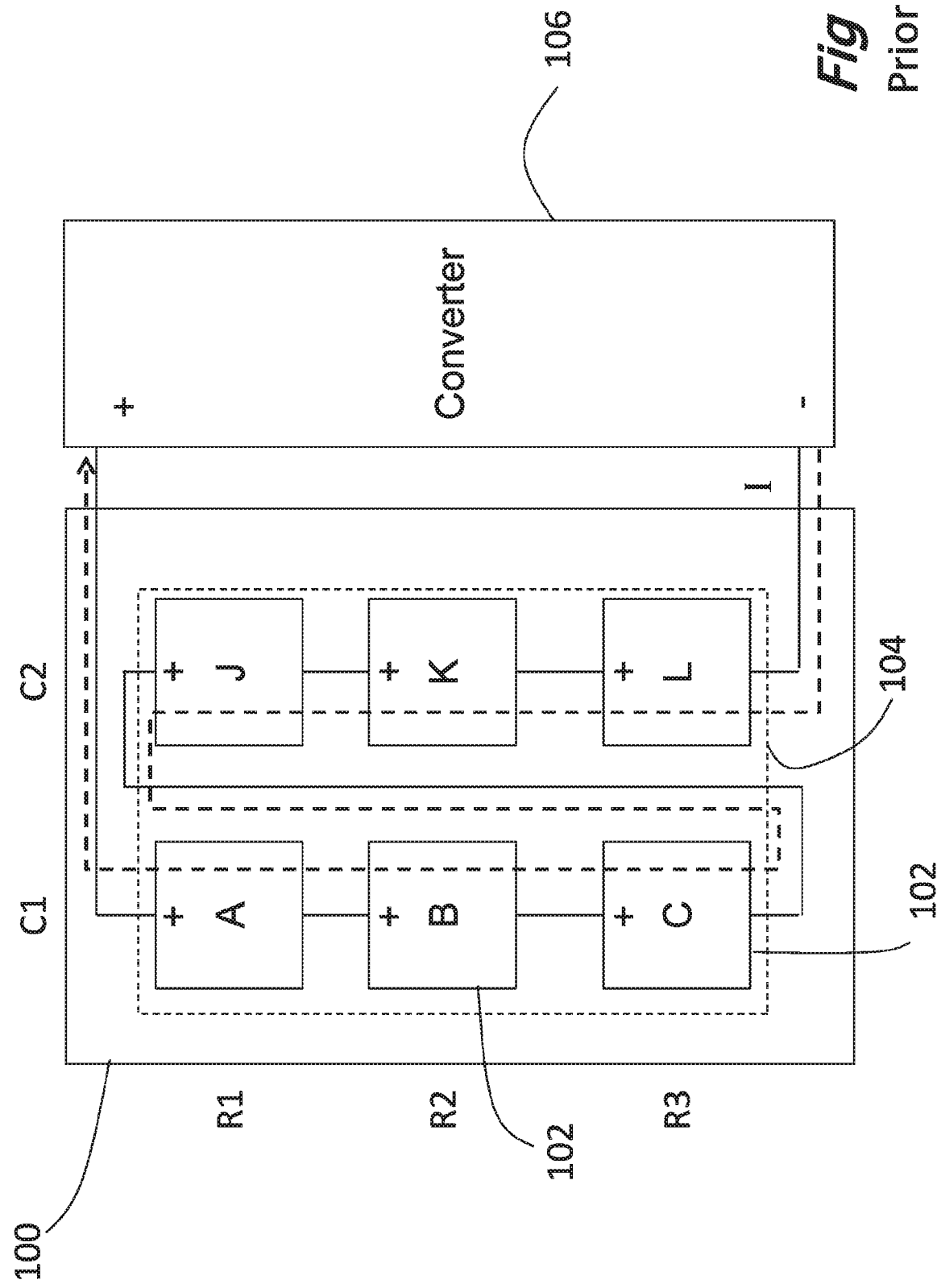
Figure 2B:
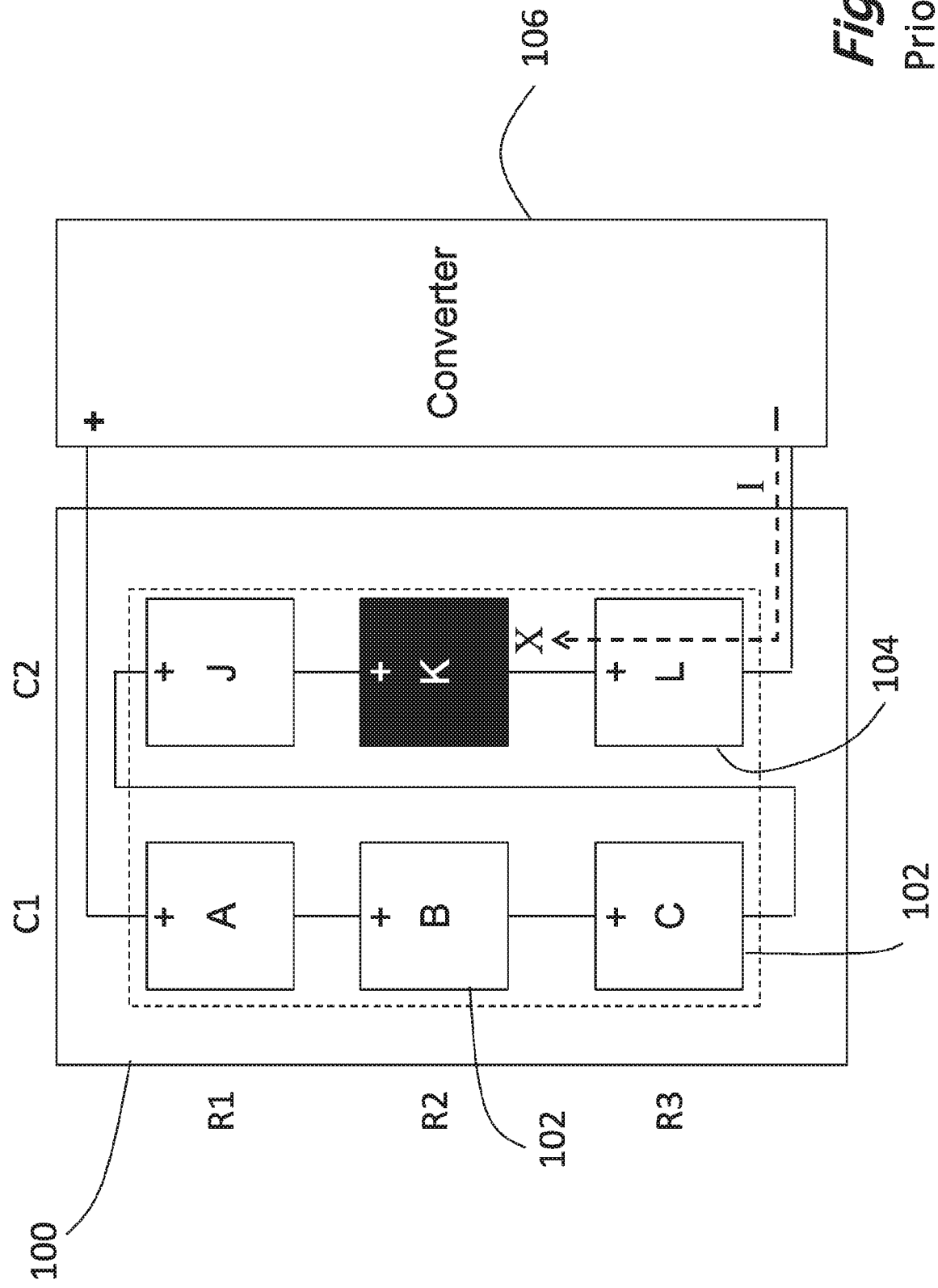
Figure 2C:
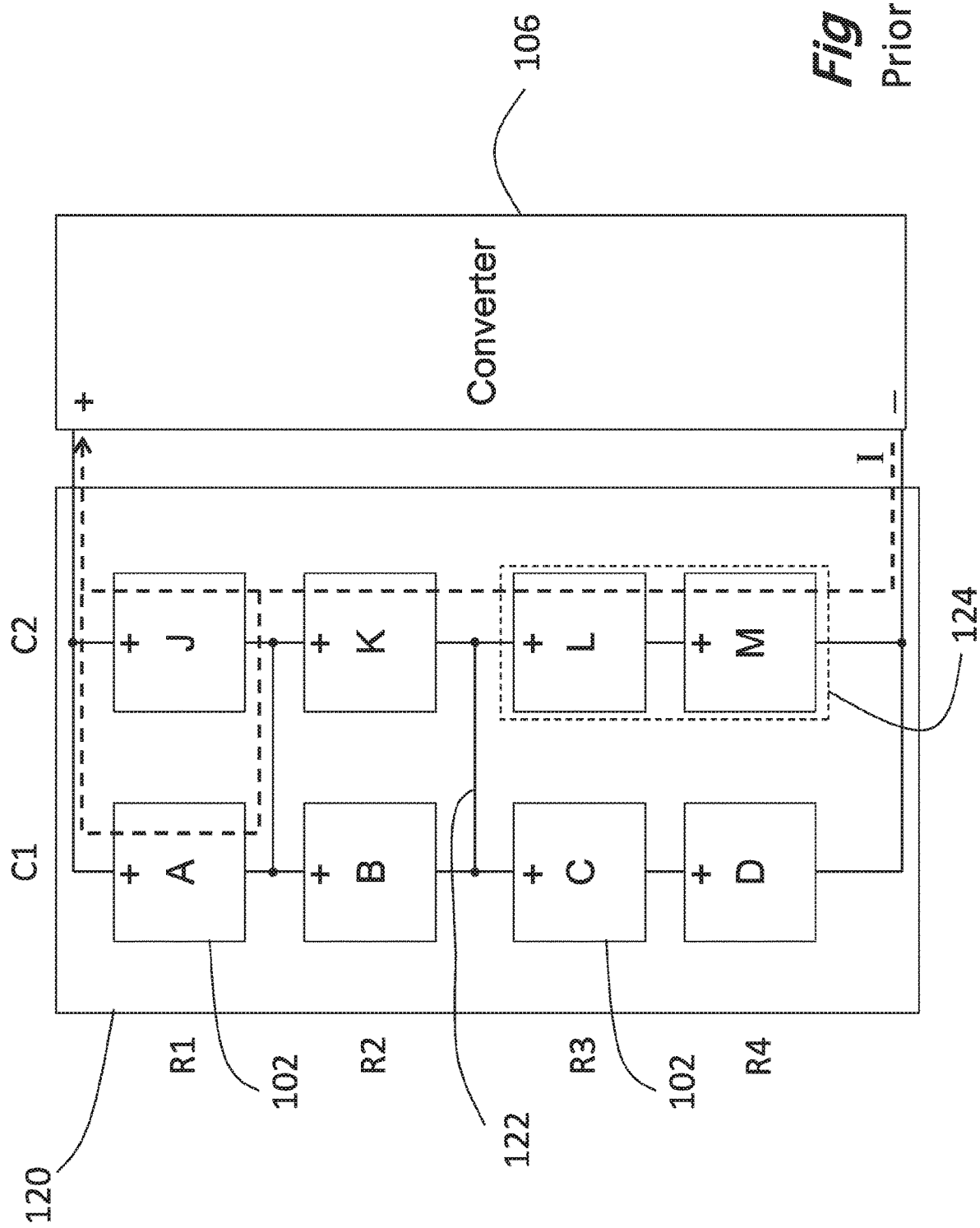
Figure 3A:
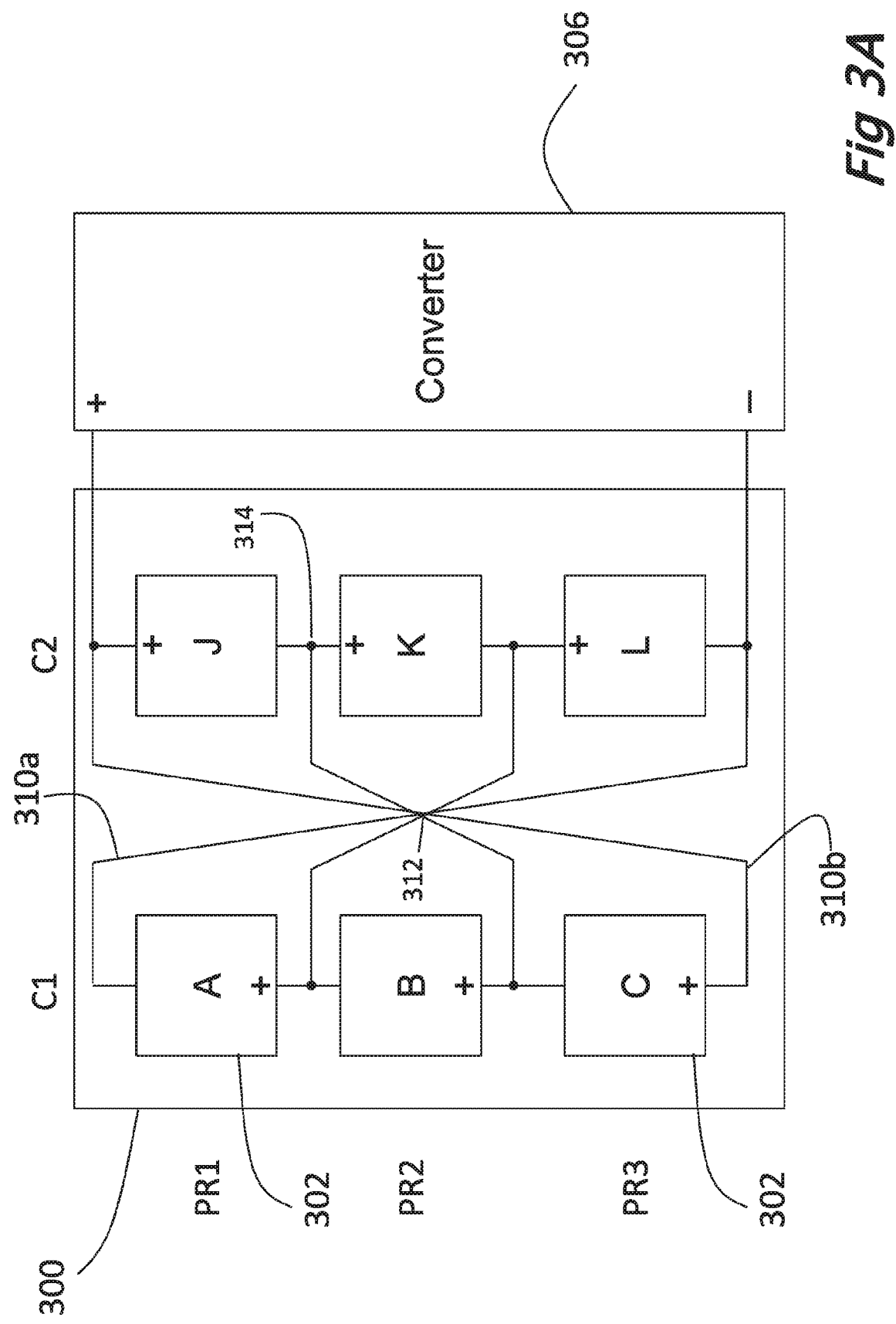

Reference is now made to FIGS. 3A-3F showing exemplary schematic illustrations of a pre configure, non-reconfigurable solar module 300 according to at least some embodiments of the present invention. As shown in FIG. 3A, solar array module 300 includes solar cells 302 physically arranged in a matrix of physical rows (PR1, PR2, and PR3) and columns (C1, C2). For example, PR3 includes cells C and L. While a matrix of three rows and two columns is shown, it should be appreciated that any size matrix may be provided and the description below is not limited to a particular matrix size.

Solar array module 300 is connected to a power DC/DC converter/transformer 306 which includes MOSFET transistors or other type of transistors arranged in a push-pull configuration, wherein the operational duty cycle of the transistors is constant and there is a dead time for preventing the fast transistors from conducting simultaneously between the switching time ON to OFF or OFF to ON of the transistors. This, yields a duty cycle that is just less than 50%, such as any of 48% or 49%, or 49.9% or other values between 42% and just below 50%, or between 43% and just below 50%, such as up to 49.9% and just below 50%.

FIG. 3B is an alternate illustration of solar array module 300 of FIG. 3A. As shown in FIG. 3B, module 300 includes solar cells 302 electrically arranged in a matrix of electrical rows (ER1, ER2, and ER3) and columns (C1, C2). For example, ER3 includes cells A and L. Thus the physical rows and electrical rows only partially overlap. In the electrical matrix the cells 302 in each column are connected in series and the cells 302 of each electrical row (ER1, ER2, and ER3) are connected in parallel by crossing connections 310 such as 310a and 310b. The electrical matrix shown in FIG. 3B is thus a crisscross matrix. For the sake of clarity, it should be noted that crossing connections 310 that are shown as intersecting one another (such as at point 312 in FIG. 3A) do not make electrical contact. Junctions of electrical connection are shown as a black dot as at 314. This convention is consistent across all figures presented.

Referring back to FIG. 3A, in order to implement the electrical crisscross matrix of FIG. 3B, cells A, B, and C of column C1 are physically inverted, polarity-wise, with respect to cells J, K, and L of column C2. Additionally, crossing connections 310 extend across physical rows. For example, connection 310a connects the negative side of cell A in PR1 to the negative side of cell L in PR3.

In operation, current I can flow through any of the paths available. As shown in FIG. 3B, current I flows through all cells 302 and makes use of all crossing connections 310.

Figure 3C:
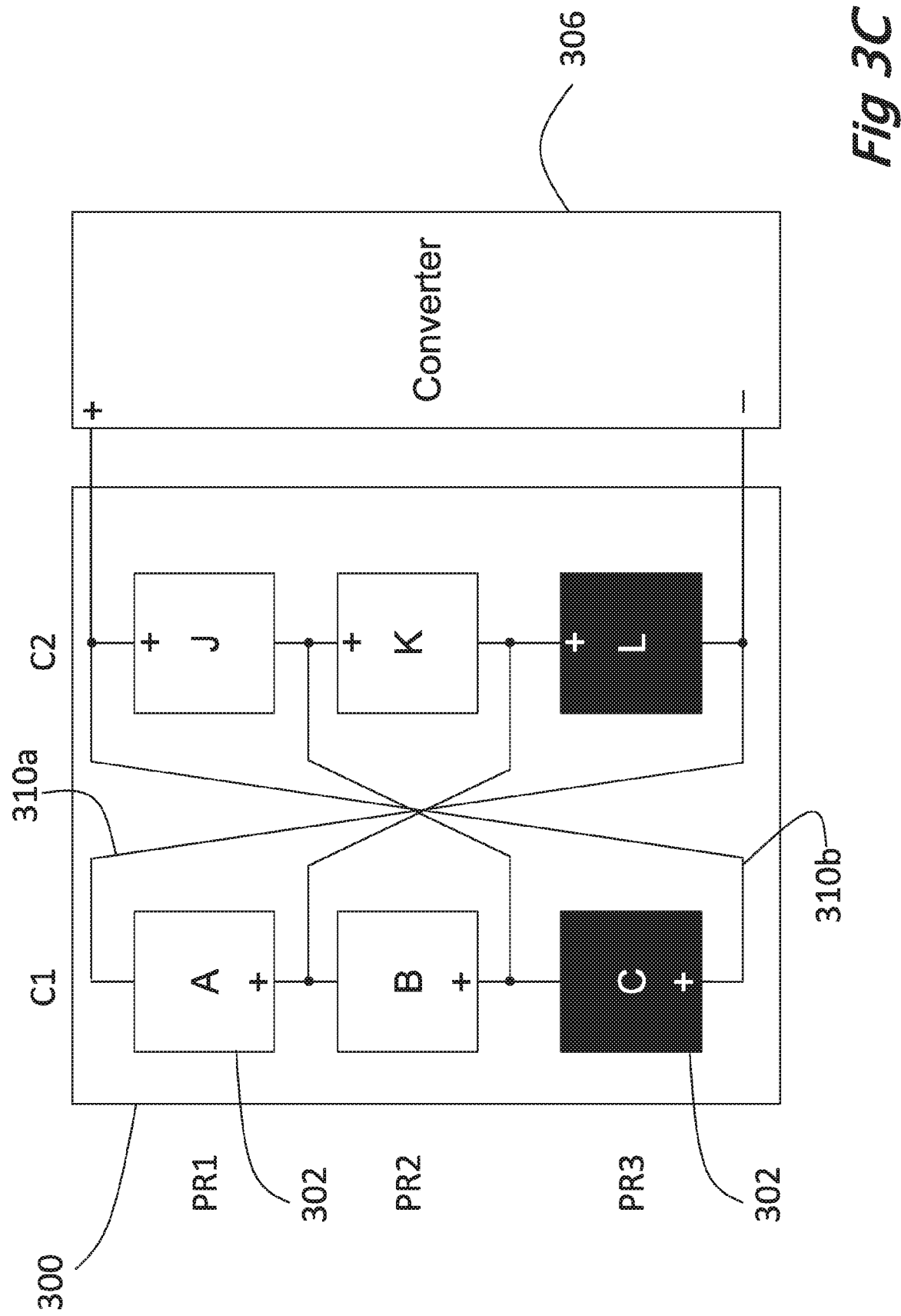
Figure 3D:
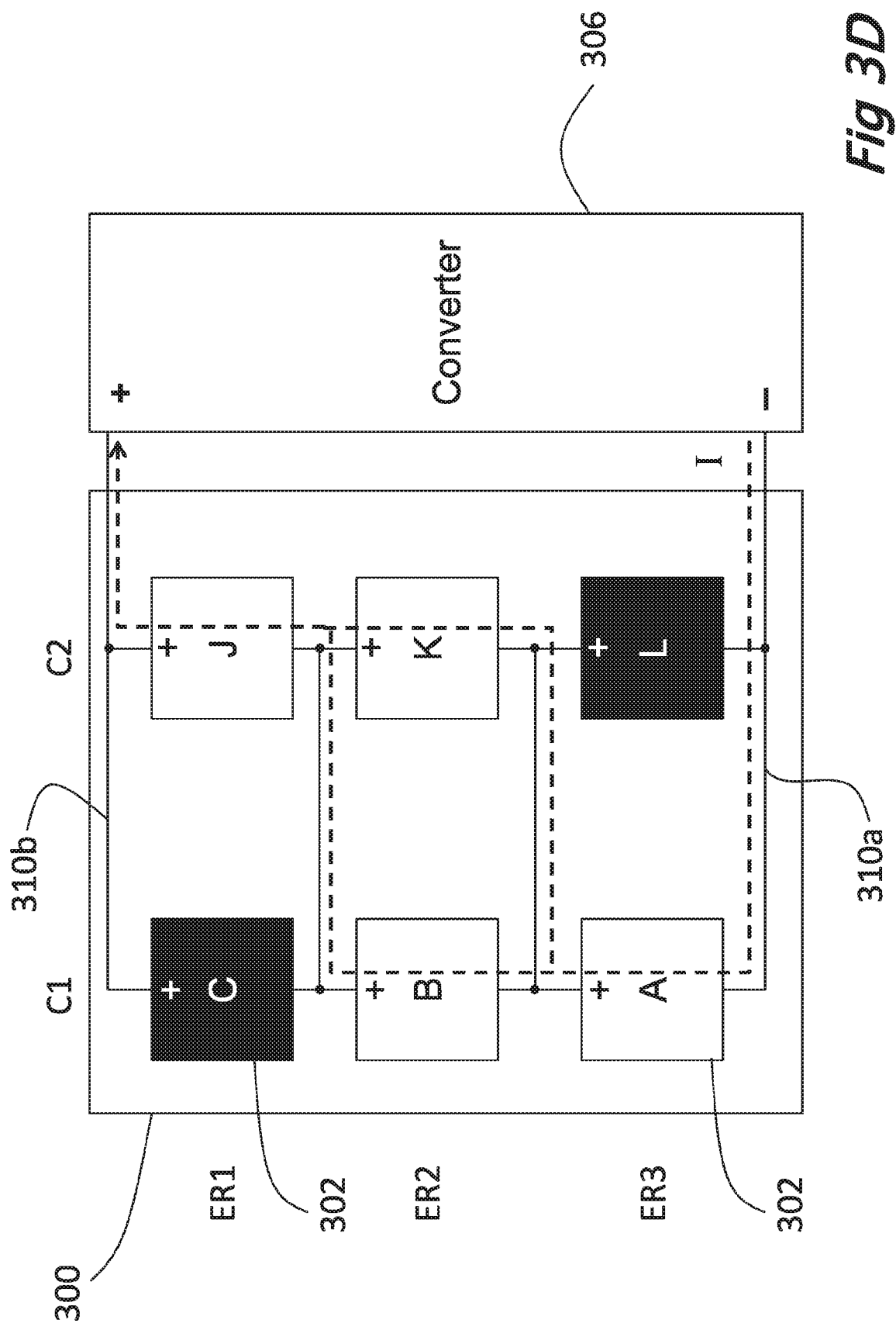

FIG. 3C shows the physical layout of module 300 with physical row PR3 shaded or otherwise malfunctioning. FIG. 3D shows the illustration of FIG. 3B, illustrating the electrical row layout with fully shaded physical row PR3 (with reference to FIG. 3C). PR3 includes cells C and L which are shown as shaded in FIG. 3C and FIG. 3D. While the physical row PR3 is shaded, none of the electrical rows are fully shaded due to the differing partially overlapping physical and electrical matrix arrangements. As shown in FIG. 3D, current I passively routes around shaded cells C and L and flows through solar cells A, B, K and J.

Figure 3E:
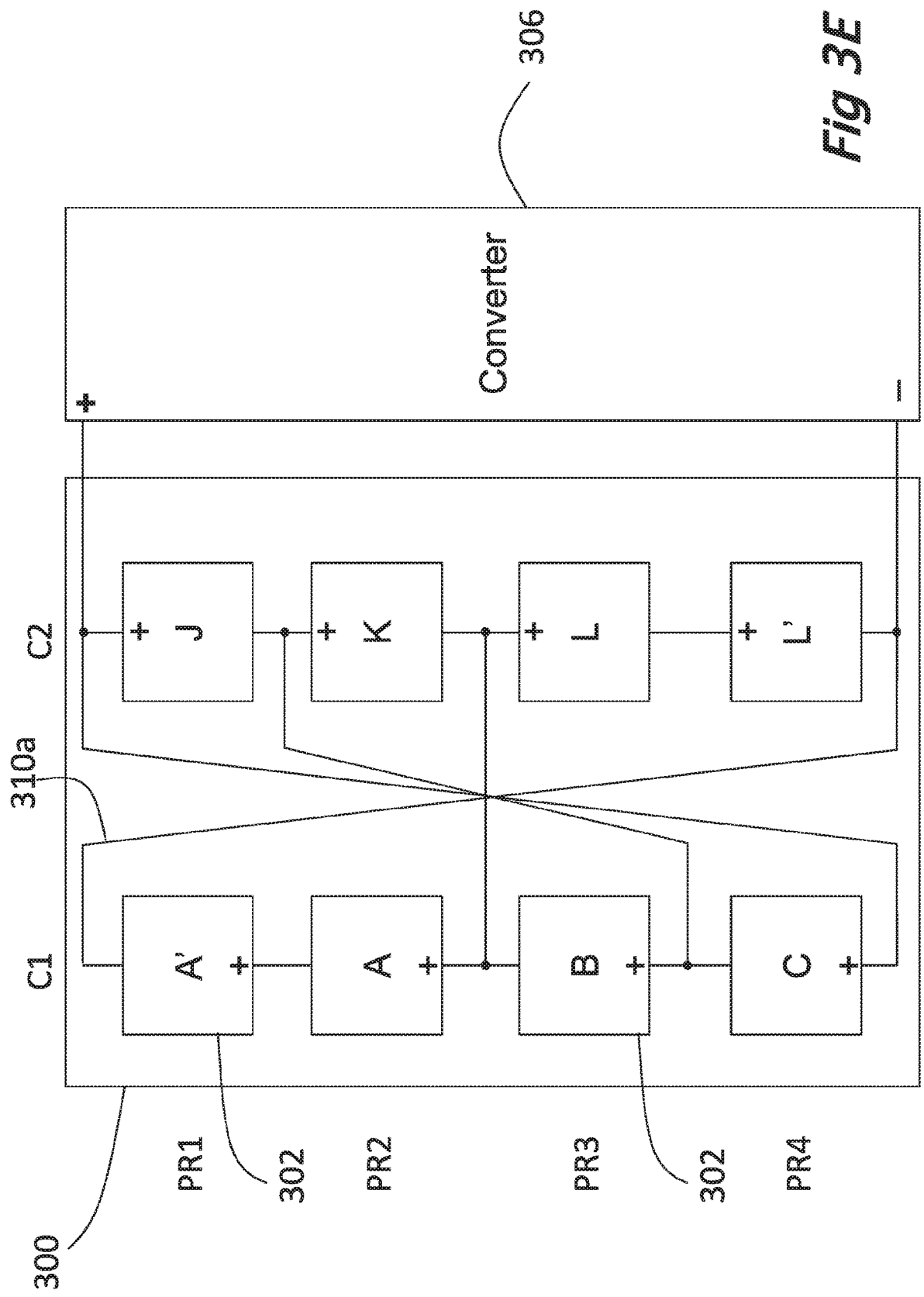

Each of the solar cells referred to in FIGS. 3A-3D may optionally be a plurality of solar cells connected in series and referred to as a serial unit. For example, the solar cells represented by A and L may include a serial unit of two or more solar cells connected in series. This is illustrated in FIGS. 3E and 3F which show physical and electrical layouts respectively. FIG. 3E illustrates a physical matrix of 4 rows while FIG. 3F illustrates the same matrix but with 3 electrical rows as A and A' as well as L and L' are serial units of 2 cells each. Current I is shown as flowing through all available paths in FIG. 3F.

Serial units may be utilized to reduce the amount anti complexity wiring needed in the solar array module. While a serial unit is shown as having two cells it should be appreciated that any number of cells may form a serial unit.

Figure 4:
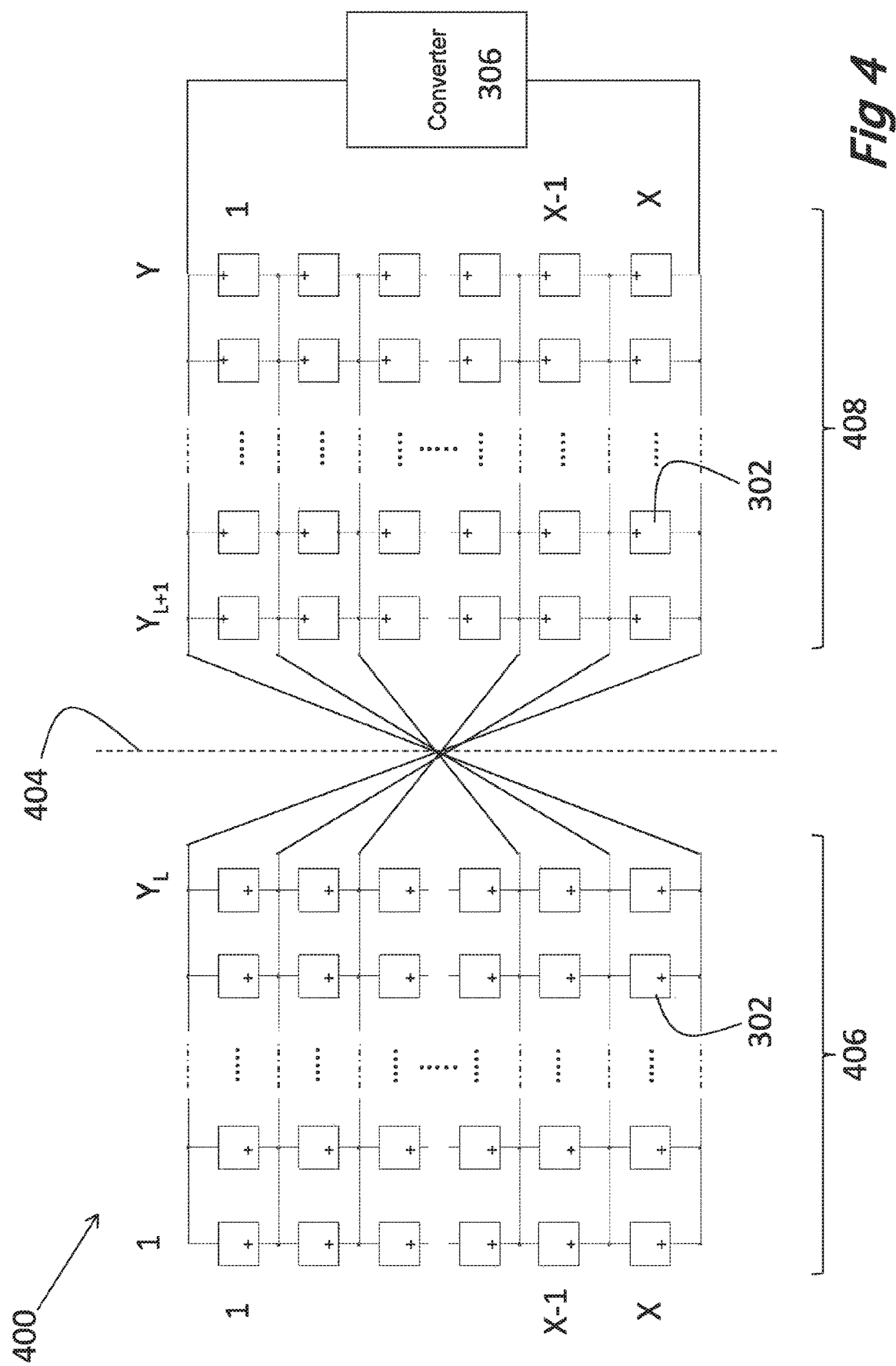
FIG. 4 is a generic schematic diagram of a solar cell module according to some embodiments of the present invention.

FIG. 4 is an exemplary generic solar module according to at least some embodiments of the present invention. FIG. 4 is a generic illustration of the embodiment of FIGS. 3A to 3D. As shown in FIG. 4, a pre-configured, non-reconfigurable solar module 400 has X physical rows and Y columns or solar cells 302. X and Y may be any integer. References in the description of FIG. 4 are to physical rows and columns. As above, cells 302 may be serial units of 2 or more solar cells electrically connected in series.

The matrix is divided alone a virtual vertical line 404 defining $Y_L$ columns to the left of line 404 and $Y-Y_L$ columns to the right of line 404. The choice of where to split the matrix is based on the level of shade protection that is required for the solar array in module depending on the likelihood of certain cells falling into shade.

$Y_L$ columns on a first side 406 of the line 404 include cells 302 inverted polarity-wise relative to the cells 302 on the second side 408 of virtual line 404. That is, each solar cell 302 of the first side 406 is physically inverted with respect to the second side 408, such that the polarity of each solar cell 302 is inverted as shown in FIG. 4: the "+" side of each cell 302 on the first side 406 is shown in at the lower side of each solar cell 302, while the "+" side of each cell 302 on the second side 408 is shown in the upper side of each solar cell 302. It should be noted that electrical connectivity of solar module 400 remain a plain criss-cross matrix.

Cells 302 in every column are connected in series.

Cells 302 in each physical row segment on the first side 406 are electrically connected in parallel.

Cells 302 in each physical row segment on the second side 408 are electrically connected in parallel.

The negative side of cell 302 in the $1+n^{th}$ row of column $Y_L$ is electrically connected to the negative side of cell 302 in the $X-n^{th}$ row of column $Y_{L+1}$ where n is an integer and $0 \leq n < X$.

The positive side of cell 302 in the $X^{th}$ row of column $Y_L$ is electrically connected to the positive side of cell 302 in the $1^{st}$ row of column $Y_{L+1}$; and Optionally, as shown in FIG. 4, a power converter 306 may be connected to the positive side of row 1 and the negative side of row X on the second side 408. Alternatively, power converter 306 may be connected to the positive side of physical row X on first side 406 and to the negative side of the $1^{st}$ physical row on the first side 406.

Figure 5C:
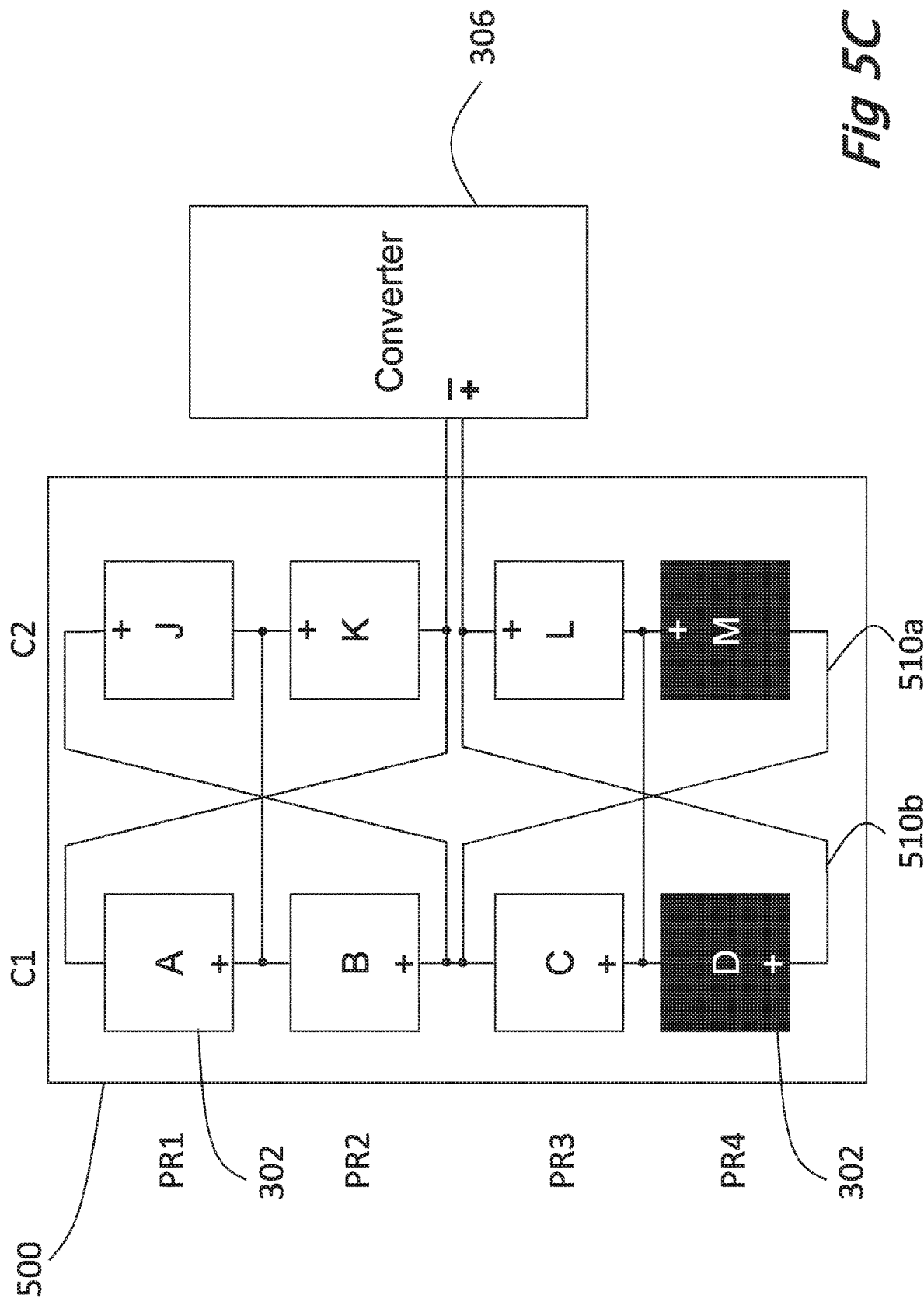

Reference is now made to FIGS. 5A-5D which are exemplary schematic illustrations of a pre-configured, non-reconfigurable solar module 500 according to at least some embodiments of the present invention. As shown in FIG. 5A, module 500 includes solar cells 302 physically arranged in a matrix of physical rows (PR1, PR2, PR3 and PR4) and columns (C1, C2). For example, PR3 includes cells C and L. While a matrix of four rows and two columns is shown, it should be appreciated that any size matrix may be provided and the description below is not limited to a particular matrix size. The solar array module is connected to a power DC/DC converter/transformer 306 as described above.

FIG. 5B is an alternate illustration of the solar array module 500 of FIG. 5A. As shown in FIG. 5B, module 500 includes solar cells 302 electrically arranged in a matrix of electrical rows (ER1, ER2, ER3, and ER4) and columns (C1, C2). For example, ER3 includes cells C and M. Thus the physical rows and electrical row's only partially overlap. The embodiment of FIGS. 5A-5C differs from that of FIGS. 3A-3C in that the electrical matrix is divided into two crisscross matrices. Each crisscross matrix includes an equal number of rows. As shown, electrical rows ER1 and ER2 represent one crisscross matrix and rows ER3 and ER4 represent a second crisscross matrix. Cells B and C are electrically connected to join the two crisscross matrices. The crisscross matrices are formed by crossing connections 510 such as 510a and 510b.

Referring back to FIG. 5A, in order to implement the electrical crisscross matrices of FIG. 5B, cells A, B, C, and B of column C1 are physically inverted, polarity-wise, with respect to cells J, K, L, and M of column C2. Additionally, crossing connections 510 extend across physical rows. For example, connection 510a connects the negative side of cell C in PR3 to the negative side of cell M in PR4.

In operation, current I can flow through any of the paths available, as shown in FIG. 5B.

Figure 5D:
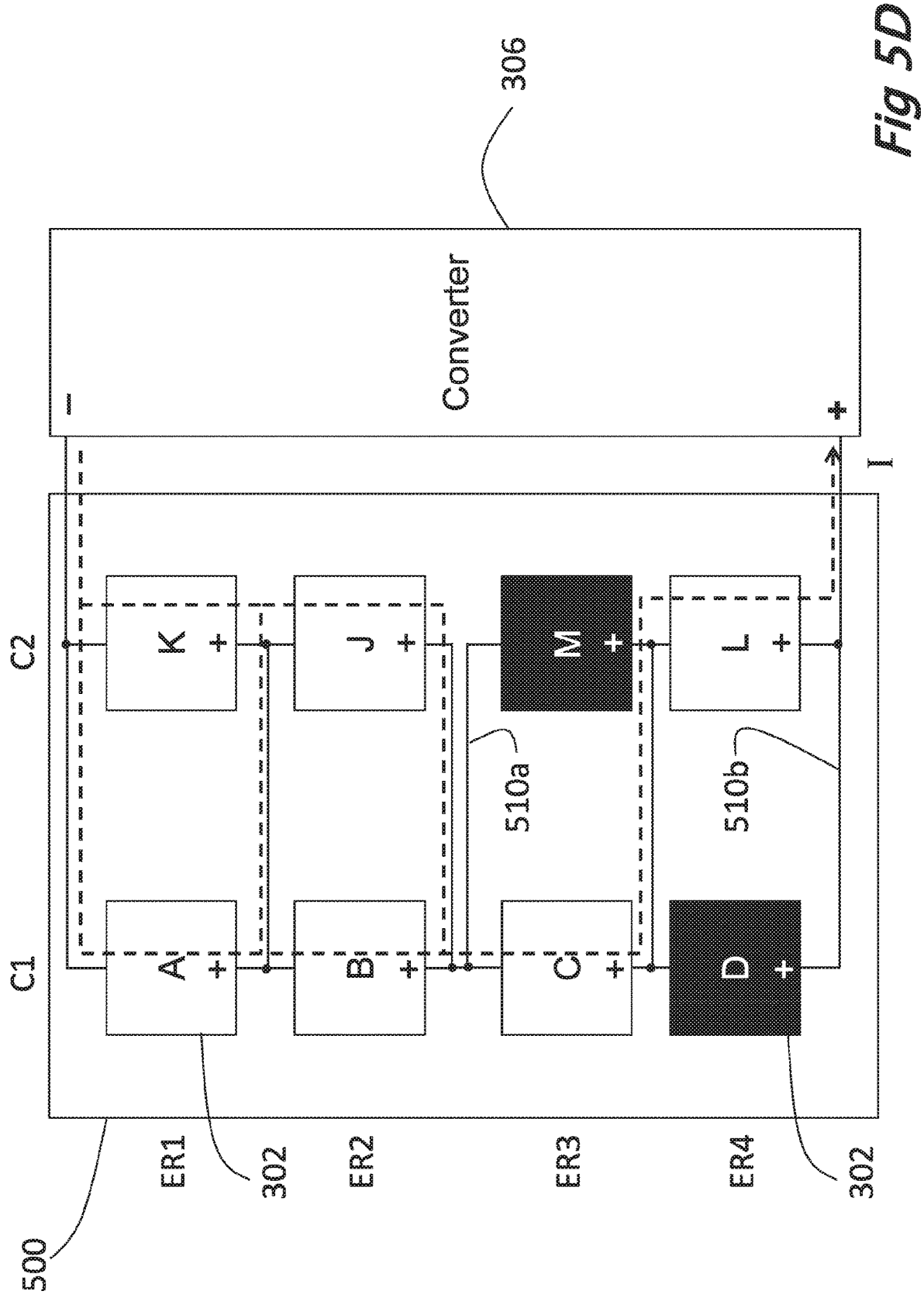

FIG. 5C shows the physical layout of module 500 with physical row PR4 shaded. FIG. 5D shows the illustration of FIG. 5B, illustrating the electrical row layout, with fully shaded physical row PR4 (with reference to FIG. 5C). PR4 includes cells D and M which are shown as shaded in FIGS. 5C and 5D. While the physical row PR4 is shaded none of the electrical rows are fully shaded due to the differing partially overlapping physical and electrical matrix arrangements. As shown in FIG. 5D, current I passively routes around shaded cells D and M and flows through cells L, C, B, A and also through J, and K.

Each of the solar cells referred to in FIGS. 5A-5D may optionally be a plurality of solar cells connected in series and referred to as a serial unit. For example, the solar cell represented by "A" may include a serial unit of two or more solar cells connected in series.

Figure 6:
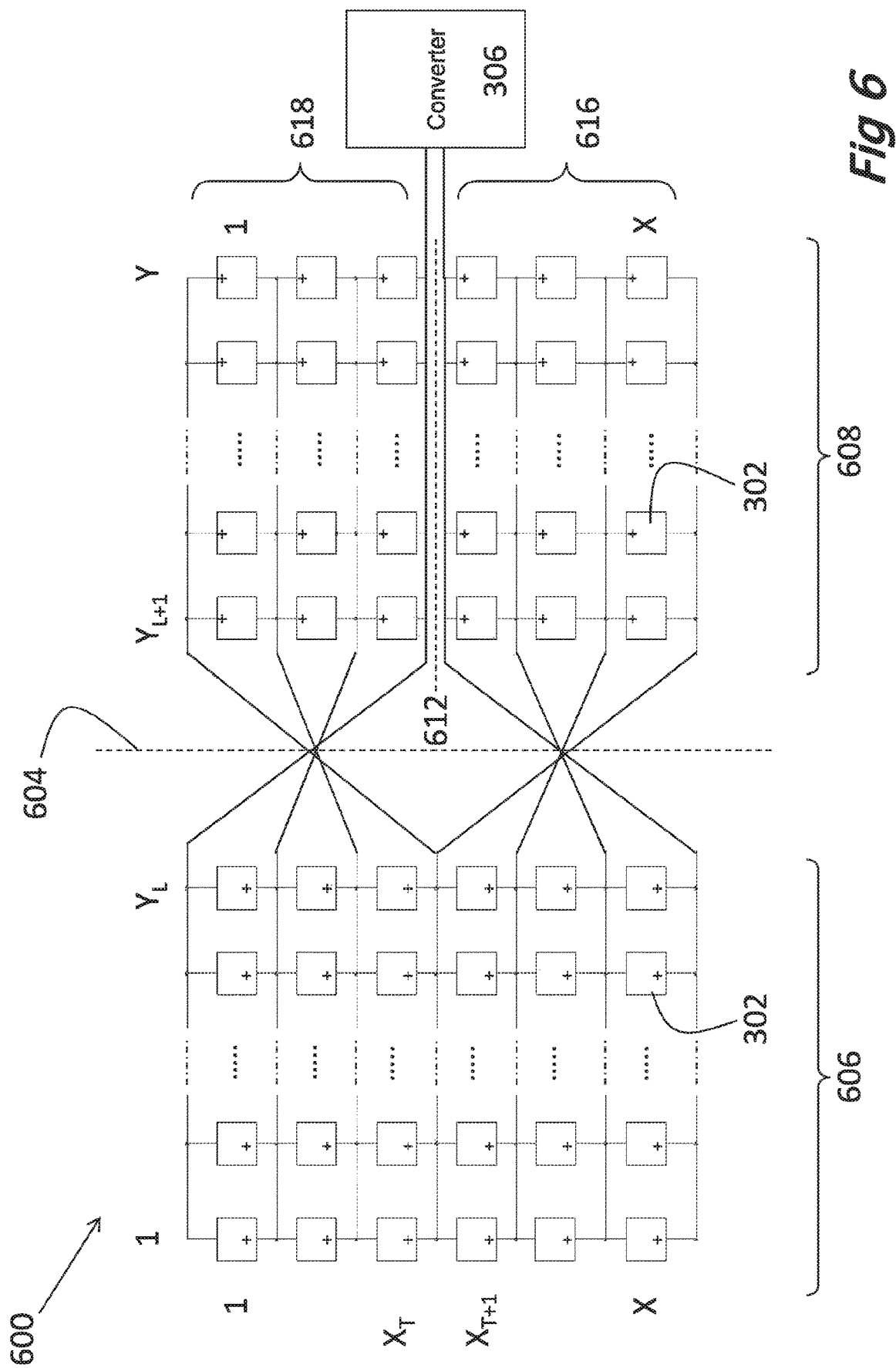
FIG. 6 is a generic schematic diagram of a solar cell module according to some embodiments of the present invention.

FIG. 6 is an exemplary generic solar module according to at least some embodiments of the present in FIG. 6 is a generic illustration of the embodiment of FIGS. 5A to 5C. As shown in FIG. 6, a pre-configured, non-reconfigurable solar module 600 has X physical rows and Y columns of solar cells 302. References in the description of FIG. 6 are to physical rows and columns. X and Y may be any integer. As above, cells 302 may be serial units of 2 or more cells.

The matrix is divided along a virtual vertical line 604 defining $Y_L$ columns to the left of line 604 and Y-$Y_L$ columns to the right of line 604. The choice of where to split the matrix is based on the level of shade protection that is required for the solar array module depending on the likelihood of certain cells falling into shade.

$Y_L$ columns on a first side 606 of the line 604 include cells 302 inverted polarity-wise relative to the cells 302 on the second side 608 of virtual line 604. That is, each solar cell 302 of the first side 606 is physically inverted with respect to the second side 608, such that the polarity of each solar cell 302 is inverted as shown in FIG. 6: the "+" side of each cell 302 on the first side 606 is shown in at the lower side of each solar cell 302, while the "+" side of each cell 302 on the second side 608 is shown in the upper side of each solar cell 302. It should be noted that electrical connectivity of solar module 600 remain a plain criss-cross matrix.

The matrix of second side 608 is divided along a virtual horizontal line 612 defining $X_T$ physical rows above the line and X-$X_T$ physical rows below the line where physical rows $X_T$ and $X_{T+1}$ are adjacent physical rows on either side of line 612.

Cells 302 in every column on first side 606 are connected in series.

Cells 302 in each physical row on the first side 606 are electrically connected in parallel.

Cells 302 in every column of the upper section 618 of second side 608 are connected in series.

Cells 302 in each physical row of the upper section 618 of second side 608 are electrically connected in parallel.

Cells 302 in every column of the lower section 616 of second side 608 are connected in series.

Cells 302 in each physical row of the lower section 616 of second side 608 are electrically connected in parallel.

The negative side of cell 302 in the 1+$n^{th}$ physical row of column $Y_L$ is electrically connected to the negative side of cell 302 in the $X_T$-$n^{th}$ physical row of column $Y_{L+1}$ where n is an integer and 0≤n<$X_T$.

The positive side of cell 302 in the $X_T^{th}$ physical row of column $Y_L$ is electrically connected to the positive side of cell 302 in the $1^{st}$ physical row of column $Y_{L+1}$.

The negative side of cell 302 in the $X_{T+1}$+$n^{th}$ physical row of column $Y_L$ is electrically connected to the negative side of cell 302 in the X-$n^{th}$ physical row of column $Y_{L+1}$ where n is an integer and $X_{T-1}$<n<X.

The positive side of cell 302 in the $X^{th}$ physical row of column $Y_L$ is electrically connected to the positive side of cell 302 in the $X_{T+1}^{th}$ physical row of column $Y_{L+1}$.

Optionally, as shown in FIG. 6, power converter 306 may be connected to the positive side of physical row $X_{T+1}$ on second side 608 and to the negative side of physical row $X_T$ on the second side 608. Alternatively, power converter 306 may be connected to the positive side of physical row X on first side 606 and to the negative side of the $1^{st}$ physical row on the first side 606.

Figure 7B:
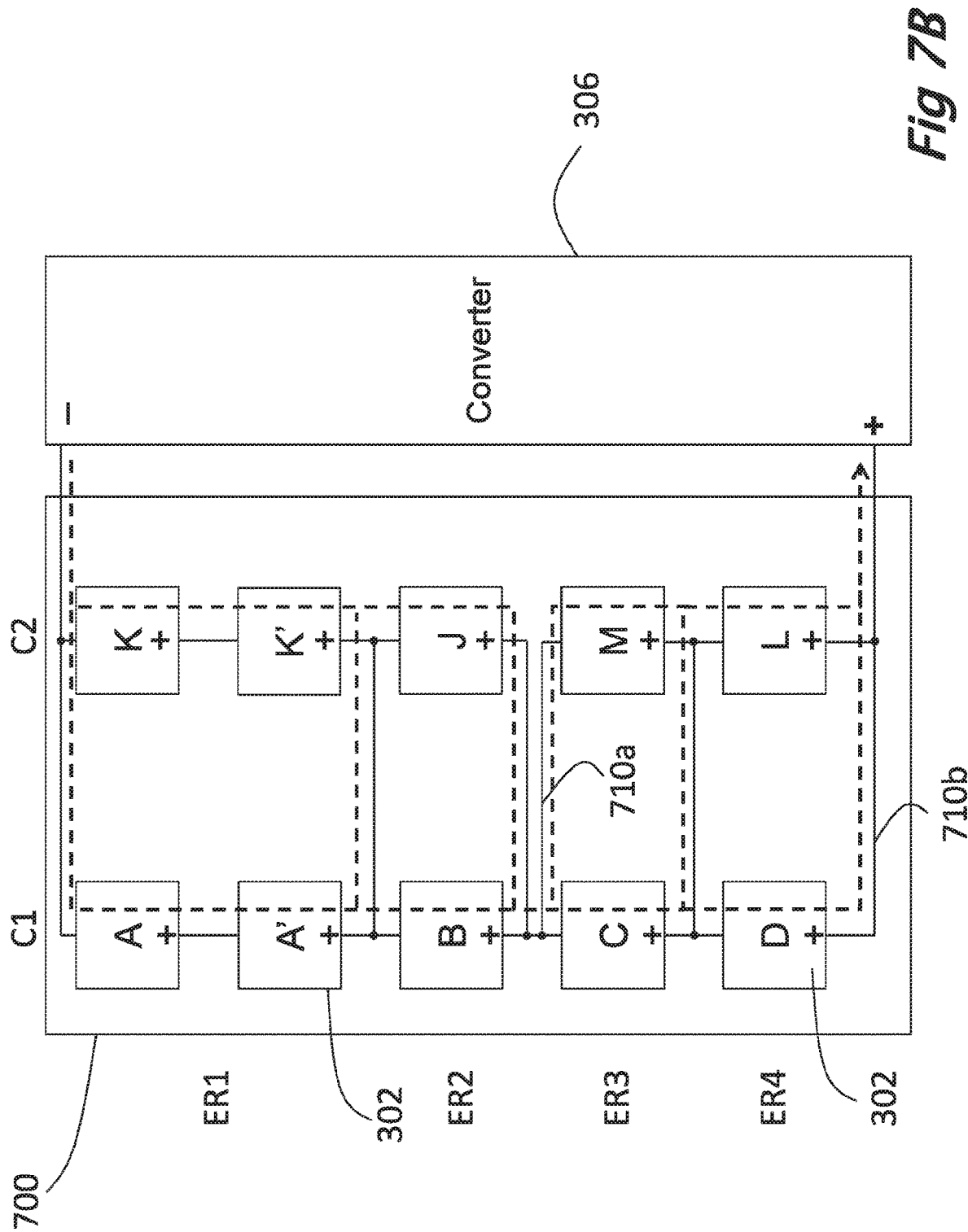

Reference is now made to FIGS. 7A-7D which are exemplary schematic illustrations of a pre-configured, non-reconfigurable solar module 700 according to at least some embodiments of the present invention. As shown in FIG. 7A, module 700 includes solar cells 302 physically arranged in a matrix of physical rows (PR1, PR2, PR3, PR4, and PR5) and columns (C1, C2). For example, PR4 includes cells C and L. FIGS. 7A-7D illustrate the inclusion of serial units having two solar cells (A and A', and K and K'). While a matrix of five rows and two columns is shown it should be appreciated that any size matrix may be provided and the description below is not limited to a particular matrix size. Similarly, the size of a serial unit shown is 2 cells but the serial unit may include any number of cells. The solar array module is connected to a power DC/DC, converter/transformer 306 as described above.

FIG. 7B is an alternate illustration of Lite solar array module 700 of FIG. 7A. As shown in FIG. 7B, module 700 includes solar cells 302 electrically arranged in a matrix of four electrical rows (ER1, ER2, ER3, and ER4) and columns (C1, C2). ER1 is only one electrical row as it includes serial unit connected in parallel. Thus ER1 includes serial units A (A and A') and K (K and K'). As with the previous embodiments the physical rows and electrical rows only partially overlap. In the embodiment of FIGS. 7A-7D the electrical matrix is divided into two crisscross matrices. As shown, rows ER1 and ER2 represent one crisscross matrix and rows ER3 and ER4 represent a second crisscross matrix. Cells B and C are electrically connected to join the two crisscross matrices. The crisscross matrices are formed by crossing connections 710 such as 710a and 710b.

Referring back to FIG. 7A, in order to implement the electrical crisscross matrices of FIG. 7B, cells A, A', B, C, and D of column C1 are physically inverted, polarity-wise, with respect to cells J, K, K', L, and M of column C2. Additionally, crossing connections 710 extend across physical rows. For example, connection 710a connects the negative side of cell C in PR4 to the negative side of cell M in PR5 (FIG. 7A).

In operation, current I can flow through any of the paths available as shown in FIG. 7B.

Figure 7D:
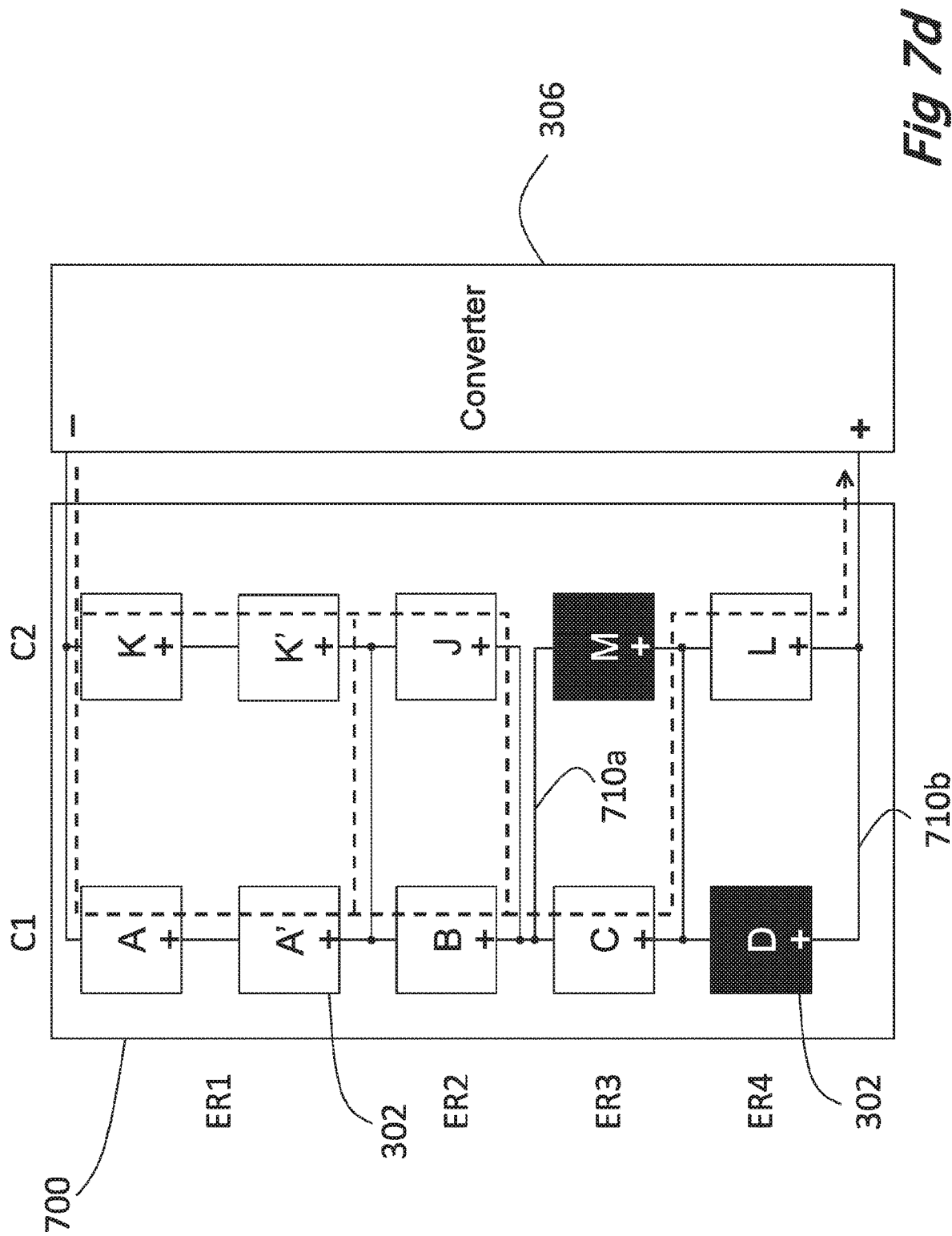

FIG. 7C shows the physical layout of module 700 with physical row PR5 shaded. FIG. 7D shows the illustration of FIG. 7B, illustrating the electrical row layout, with a fully shaded physical row PR5 (with reference to FIG. 7C). PR5 includes cells D and M which are shown as shaded in FIGS. 7C and 7D. While the physical row PR5 is shaded, none of the electrical rows (ER3 or ER4 of FIG. 7D) are fully shaded due to the differing partially overlapping physical and electrical matrix arrangements. As shown in FIG. 7D, current I passively routes around shaded cells D and M and flows through cells L, C, B, A, A' and also through J, K, and K'.

Figure 8:
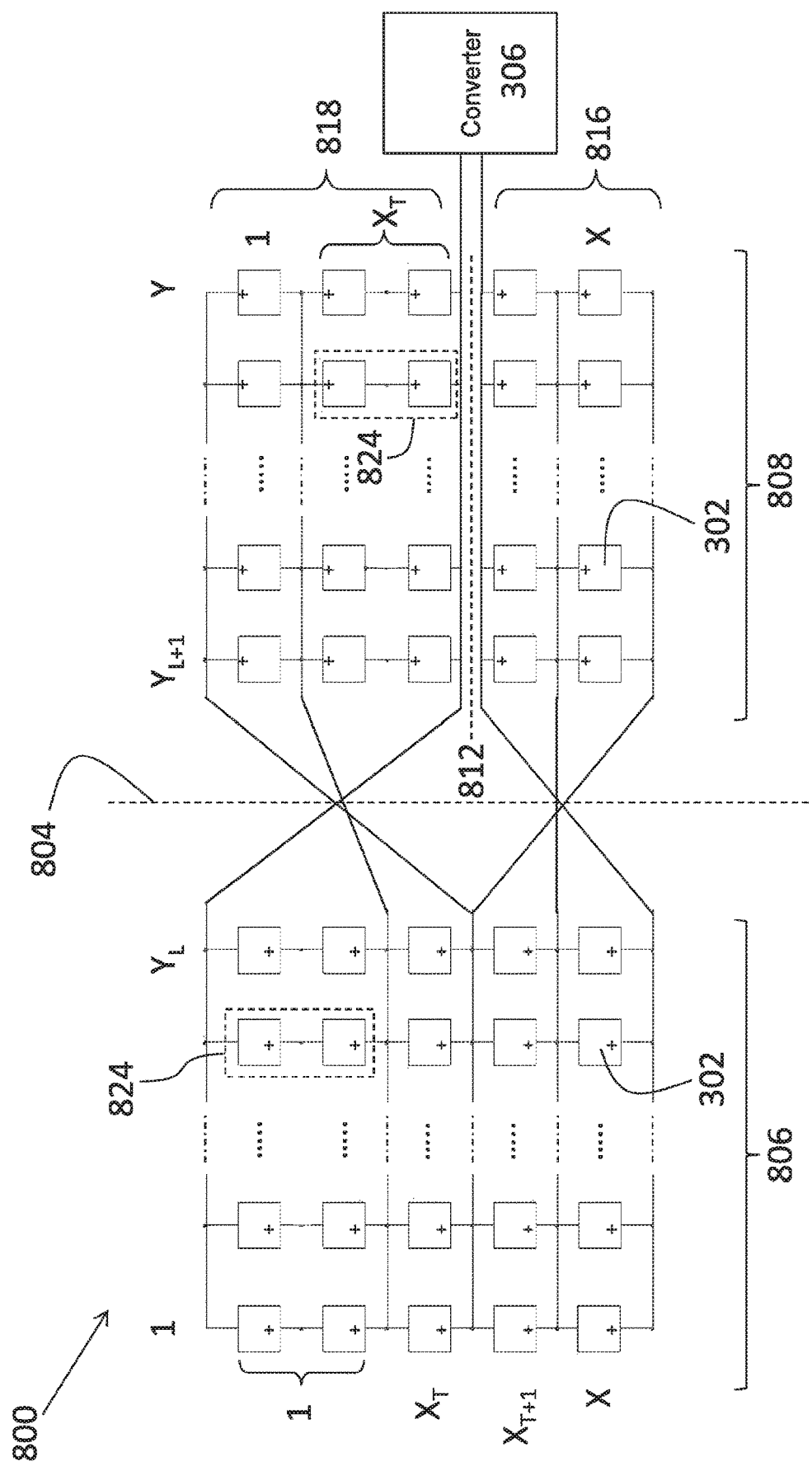
FIG. 8 is a genetic schematic diagram of a solar cell module according to some embodiments of the present invention.

FIG. 8 is an exemplary generic solar module according to at least some embodiments of the present invention. FIG. 8 is a generic illustration of the embodiment of FIGS. 7A-7D. As shown in FIG. 8, a pre-configured, non-reconfigurable solar module 800 has X physical rows and Y columns of solar cells 302. References in the description of FIG. 8 are to physical rows and columns. X and Y may be any integer.

The matrix is divided along a virtual vertical line 804 defining $Y_L$ columns to the left of line 804 and $Y-Y_L$ columns to the right of line 804. The choice of where to split the matrix is based on the level of shade protection that is required for the solar array module depending on the likelihood of certain cells falling into shade.

$Y_L$ columns on a first side 806 of the line 804 include cells 302 inverted, in terms of polarity, relative to the cells 302 on the second side 808 of virtual line 804. That is, each solar cell 302 of the first side 806 is physically inverted with respect to the second side 808, such that the polarity of each solar cell 302 is inverted as shown in FIG. 4: the "+" side of each cell 302 on the first side 806 is shown in at the lower side of each solar cell 302, while the "+" side of each cell 302 on the second side 808 is shown in the upper side of each solar cell 302. It should be noted that electrical connectivity of solar module 800 remain a plain criss-cross matrix.

The matrix of second side 808 is divided along a virtual horizontal line 812 defining $X_T$ physical rows above the line and $X-X_T$ physical rows below the line where physical rows $X_T$ and $X_{T+1}$ are adjacent physical rows on either side of line 812.

Cells 302 in every column on first side 806 are connected in series;

Cells 302 in physical rows $X_T$ to X on the first side 806 are electrically connected in parallel, wherein physical row $X_T$ includes serial units 824, having, in this example, 2 solar cells 302 in each column.

Cells 302 in every column of the upper section 818 of second side 808 are connected in series.

Cells 302 in physical row 1 of the upper section 818 of second side 808 are electrically connected in parallel, wherein solar cells 302 are arranged in serial units 824, having, in this example, 2 solar cells 302 in each column.

Cells 302 in every column of the lower section 816 of second side 808 are connected in series.

Cells 302 in each physical raw of the lower section 816 of second side 808 are electrically connected parallel.

The negative side of serial unit 824 in the physical row of column $Y_L$ is electrically connected to the negative side of serial unit 824 in the $X_T^{th}$ physical row of column $Y_{L+1}$.

The positive side of serial unit 824 in the $1^{st}$ physical row of column $Y_L$ is electrically connected to the positive side of serial unit 824 in the $X_T^{th}$ physical row of column $Y_{L+1}$.

The negative side of cell 302 in the $X_T^{th}$ physical row of column $Y_L$ is electrically connected to the negative side of cell 302 in the $1^{st}$ physical row of column $Y_{L-1}$.

The negative side of cell 302 in the $X_{T+1}+n^{th}$ physical row of column $Y_L$ is electrically connected to the negative side of cell 302 in the X-n$^{th}$ physical row of column $Y_{L+1}$ where n is an integer and $X_{T-1} < n < X$.

The positive side of cell 302 in the $X^{th}$ physical row of column $Y_L$ is electrically connected to the positive side of cell 302 in the $X_{T+1}^{th}$ physical row of column $Y_{L+1}$.

Optionally, as shown in FIG. 8, power converter 306 is connected to the positive side of physical raw $X_{T+1}$ on second side 808 and to the negative side of physical row $X_T$ on the second side 808. Alternatively, power converter 306 is connected to the positive side of physical row X on first side 806 and to the negative side of the $1^{st}$ physical row on the first side 306.

The present invention being thus described in terms of several embodiments and examples, it will be appreciated that the same may be varied in many ways. Such variations are not to be regarded as a departure from the spirit and scope of the invention, and all such modifications as would be obvious to one skilled in the art are contemplated.

What is claimed is:

1. A non-reconfigurable solar array module, pre-configured to prevent electric blockage of the module when at least one physical row of solar cells malfunctions, the solar array module comprising a matrix of X physical rows and Y columns of solar cells;
    wherein said columns are divided into a first side numbering $Y_L$ columns and a second side numbering $Y-Y_L$ columns;
    wherein $Y \geq 4$;
    wherein the first side comprises at least 2 columns and the second side comprises at least 2 columns;
    wherein $Y_L$ columns on said first side comprise solar cells that are physically inverted, polarity-wise, relative to the solar cells on said second side;
    wherein the solar cells in each of said columns are connected in series;
    wherein solar cells in each of said physical rows on said first side are electrically connected in parallel;
    wherein solar cells in each of said physical rows on said second side are electrically connected in parallel;
    wherein the negative side of the solar cell in the $1+n^{th}$ physical row of column $Y_L$ is electrically connected to the negative side of the solar cell in the X-n$^{th}$ physical row of column $Y_{L+1}$, where n is an integer and $0 \leq n < X$; and
    wherein the positive side of the solar cell in the $X^{th}$ physical row of column $Y_L$ is electrically connected to the positive side of the solar cell in the $1^{st}$ physical row of column $Y_{L+1}$.

2. The module of claim 1 further comprising a power converter connected to the positive side of physical row 1 on said second side, and the negative side of physical row X on said second side.

3. The module of claim 1 further comprising a power converter connected to the positive side of physical row X on said first side, and the negative side of physical row 1 on said first side.

4. The module of claim 3, wherein said power converter is selected from the group consisting of: a DC/DC power converter; a DC/DC transformer and a combination thereof.

5. The module of claim 4, wherein said power converter comprises a plurality of transistors for alternately connecting said power converter to said matrix of solar cells, wherein the operational duty cycle of the transistors is constant and there is a dead time for preventing said transistors from conducting simultaneously between the switching time ON to OFF or OFF to ON of the transistor.

6. The module of claim 5, wherein said dead time is less than 8% of the duty cycle.

7. The module of claim 1, wherein at least one of said solar cells in a column of solar cells is further electrically connected in series to at least one additional said solar cell in the same column, to form a serial unit.

* * * * *